(12) United States Patent
Takemura

(10) Patent No.: US 8,421,208 B2
(45) Date of Patent: Apr. 16, 2013

(54) ELECTRODE PAD HAVING A RECESSED PORTION

(75) Inventor: Kouji Takemura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/221,037

(22) Filed: Aug. 30, 2011

(65) Prior Publication Data
US 2011/0309505 A1 Dec. 22, 2011

Related U.S. Application Data

(63) Continuation of application No. PCT/JP2009/006547, filed on Dec. 2, 2009.

(30) Foreign Application Priority Data

Mar. 19, 2009 (JP) ................................. 2009-068932

(51) Int. Cl.
*H01L 23/48* (2006.01)
*H01L 21/44* (2006.01)
*H05K 7/10* (2006.01)

(52) U.S. Cl.
USPC ........... 257/692; 257/701; 257/786; 361/767; 361/772; 438/612

(58) Field of Classification Search ........................ None
See application file for complete search history.

(56) References Cited

U.S. PATENT DOCUMENTS

| 5,945,834 | A | 8/1999 | Nakata et al. | |
|---|---|---|---|---|
| 6,242,813 | B1 * | 6/2001 | Huang et al. | 257/784 |
| 2009/0184428 | A1 * | 7/2009 | Hamatani | 257/773 |

FOREIGN PATENT DOCUMENTS

| JP | 7-169806 | | 7/1995 |
|---|---|---|---|
| JP | 10-284555 | | 10/1998 |
| JP | 3467374 | | 11/2003 |
| JP | 2008-027929 | | 2/2008 |
| JP | 2008027929 | A * | 2/2008 |

* cited by examiner

Primary Examiner — Alonzo Chambliss
(74) Attorney, Agent, or Firm — McDermott Will & Emery LLP

(57) ABSTRACT

A semiconductor device includes a semiconductor integrated circuit device (1). In the semiconductor integrated circuit device (1), a semiconductor integrated circuit (5) is formed on a center of the surface of a semiconductor substrate (3), and a plurality of electrode terminals (71, 73, . . . ) are provided on the surface of the semiconductor substrate (3). A protection film (9) is provided on the surface of the semiconductor substrate (3) such that the surfaces of the electrode terminals (71, 73) are exposed. The electrode terminals (71, 73, . . . ) include an electrode terminal (73) having a thin portion (74). The surface of the thin portion (74) is located below the surfaces of the electrode terminals except for the electrode terminal (73) having the thin portion (74) among the electrode terminals (71, 73, . . . ).

14 Claims, 18 Drawing Sheets

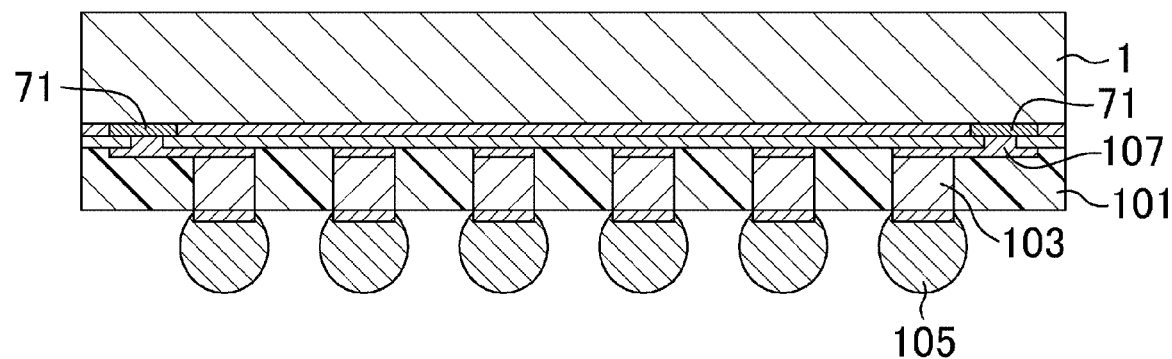
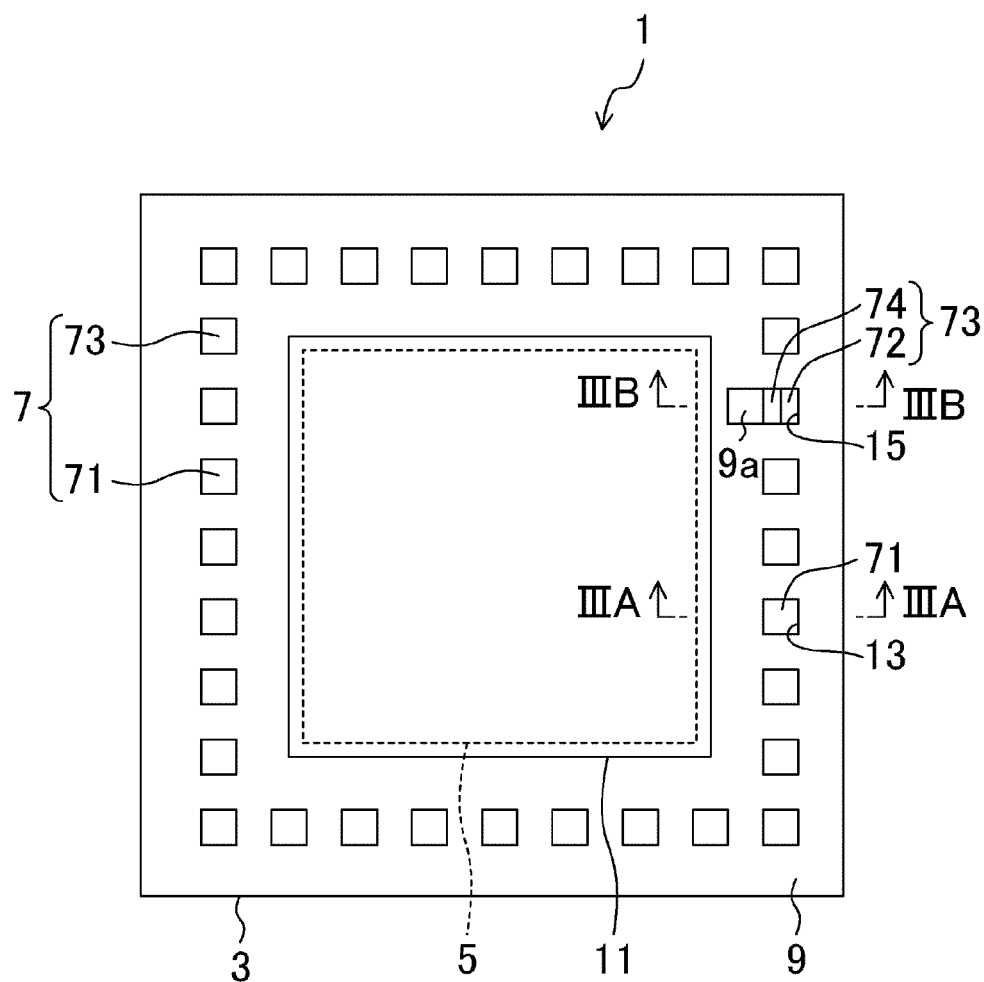

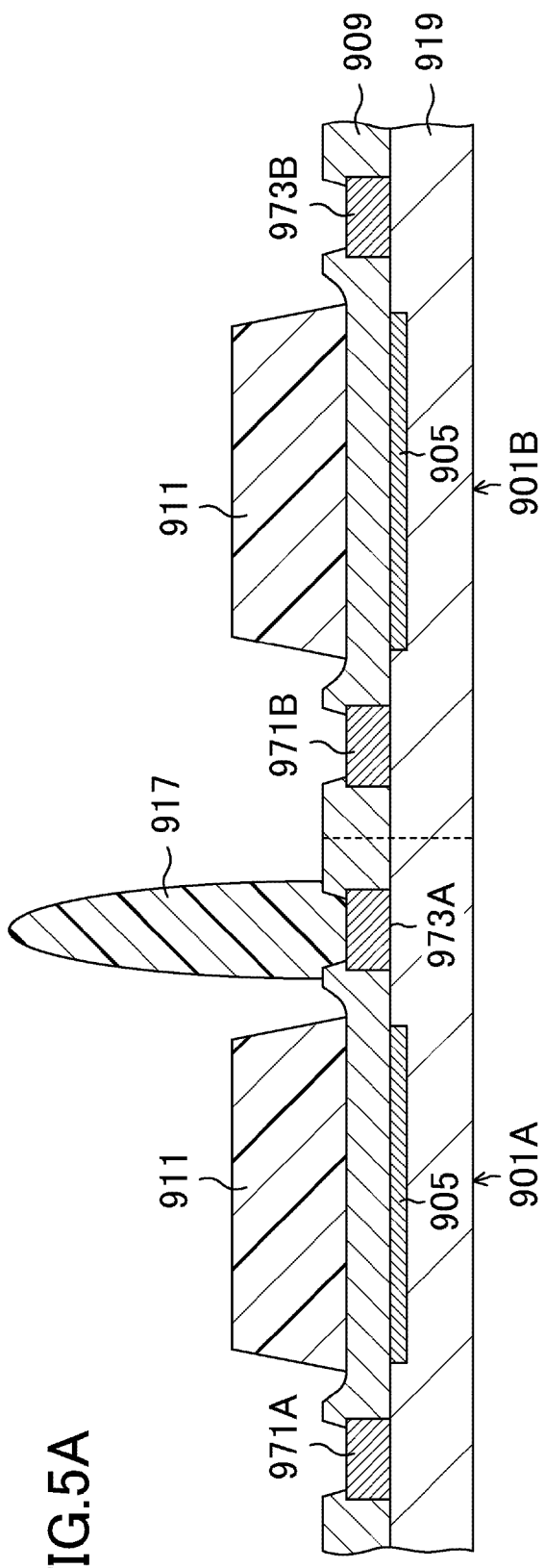
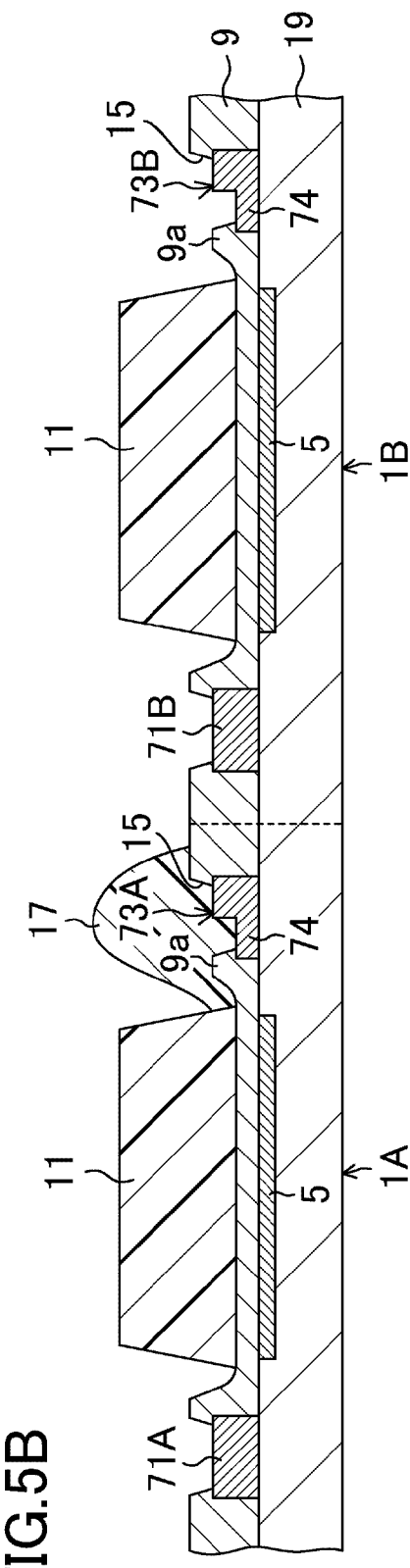

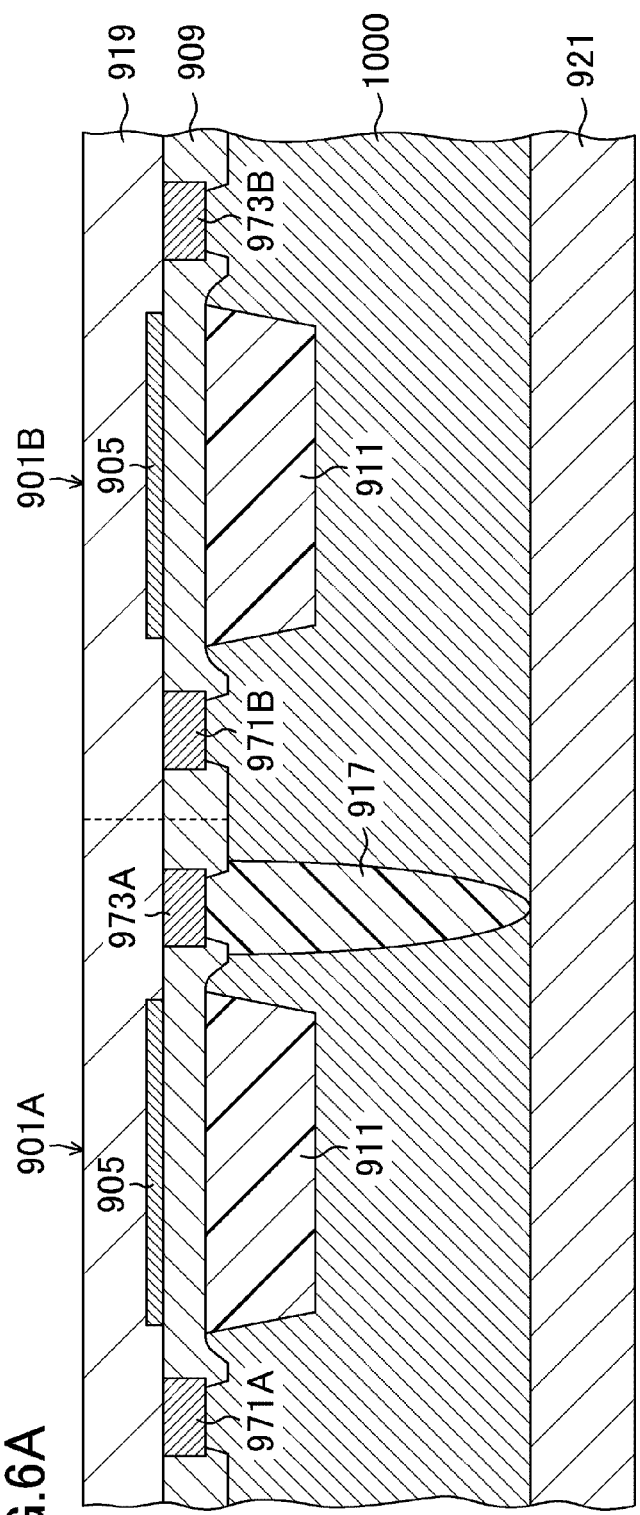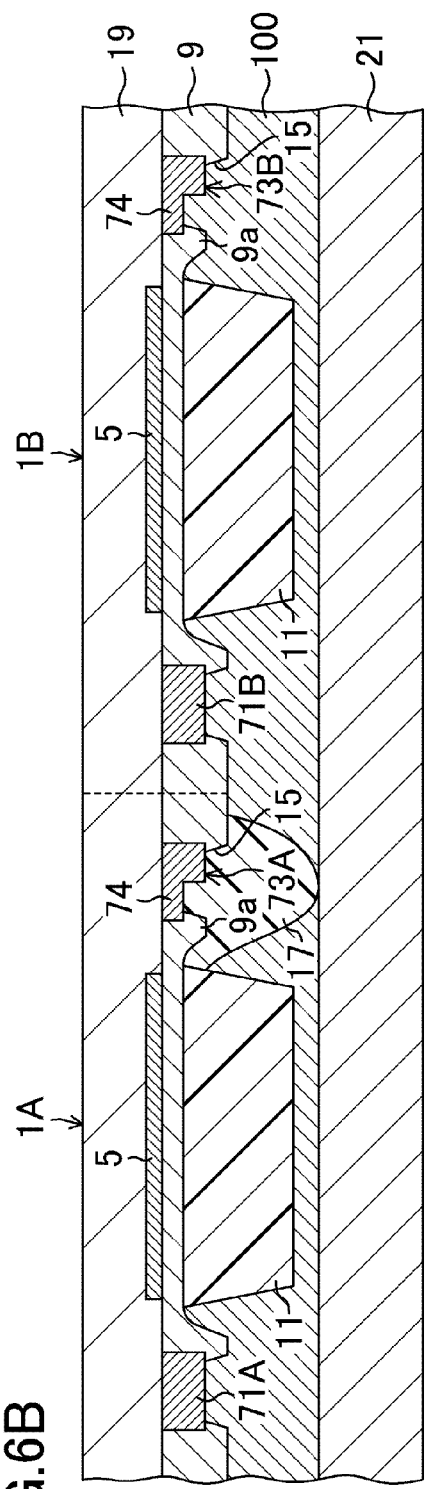

ELECTRODE PAD HAVING A RECESSED PORTION

CROSS-REFERENCE TO RELATED APPLICATION

This is a continuation of PCT International Application PCT/JP2009/006547 filed on Dec. 2, 2009, which claims priority to Japanese Patent Application No. 2009-068932 filed on Mar. 19, 2009. The disclosures of these applications including the specifications, the drawings, and the claims are hereby incorporated by reference in their entirety.

BACKGROUND

The present disclosure relates to semiconductor devices and methods for fabricating the semiconductor devices, and more particularly to a semiconductor device obtained by performing burn-in, in a batch, on semiconductor integrated circuit devices on a semiconductor wafer, and a method for fabricating the semiconductor device.

A conventional semiconductor device is fabricated by electrically connecting a semiconductor integrated circuit device to leads of a lead frame with bonding wires and then encapsulating the semiconductor integrated circuit device and the leads of the lead frame with a resin or a ceramic material. Such a semiconductor device is mounted on a printed board, and is incorporated in electronic equipment.

The electronic equipment is required of having its cost reduced. Accordingly, cost reduction of the semiconductor device is also required. This requirement leads to a demand for supplying quality-guaranteed semiconductor devices at low cost.

To guarantee the quality of semiconductor devices, burn-in is generally employed. Preferred examples of burn-in include burn-in performed, in a batch, on a plurality of semiconductor integrated circuit devices on a semiconductor wafer (where such burn-in will be hereinafter also referred to as "wafer burn-in"). This burn-in can reduce the cost for burn-in, and also reduce the cost for apparatus for use in burn-in.

Such wafer burn-in is performed using a contactor with probe tips. Each of semiconductor integrated circuit devices formed on a semiconductor wafer is provided with testing electrode terminals, which are connected to the probe tips in the wafer burn-in.

In performing wafer burn-in, it is necessary to apply a power-supply voltage, a ground voltage, or a signal to the testing electrode terminals provided on each of the semiconductor integrated circuit devices. To individually apply a power-supply voltage, a ground voltage, or a signal to the testing electrode terminals provided in each of the semiconductor integrated circuit devices, a considerably large number of wires need to be drawn on contacts or the semiconductor wafer. For this reason, this technique is not practical. As another technique, it is proposed that a common power-supply voltage line, a common ground voltage line, or a common signal line (where these lines will be hereinafter collectively referred to as "common lines") is provided on the contactor or the semiconductor wafer such that the common line is electrically connected to each of the testing electrodes. This technique can avoid the necessity of drawing a considerably large number of wires.

In such a case where the common line is provided on the contactor or the semiconductor wafer, however, a possible electrical short-circuit occurring in part of the semiconductor integrated circuit devices on the semiconductor wafer causes a short-circuit between the common power-supply voltage line and either the common ground voltage line or the common signal line through the short-circuited semiconductor integrated circuit device. To solve this problem, Japanese Patent Publication No. H07-169806 shows the following testing method. In this method, a test on electrical characteristics of each semiconductor integrated circuit device is performed prior to wafer burn-in. Then, an insulator resin is applied onto testing electrode terminals of a semiconductor integrated circuit device which has been determined to be defective in the test on electrical characteristics. Thereafter, wafer burn-in is performed.

SUMMARY

After the wafer burn-in, a back grinding process is performed in general. In the back grinding process, a back grinding sheet is provided on the top surface of the semiconductor wafer, and then the semiconductor wafer is turned upside down, and is placed on a polishing table so that the bottom surface of the semiconductor wafer is polished with a grindstone. Through this process, the thickness of the semiconductor wafer is reduced.

In testing electrical characteristics of semiconductor integrated circuit devices with the testing method described in Japanese Patent Publication No. H07-169806, an insulator resin is provided on the surfaces of the testing electrode terminals of a defective semiconductor integrated circuit device, but no insulator resin is provided on the surfaces of the testing electrode terminals of a complete semiconductor integrated circuit device. Since the height of the insulator resin on the surfaces of the testing electrode terminals of the defective semiconductor integrated circuit device is about 10 µm, the insulator resin projects from the surface of the semiconductor wafer to be higher than any other component of the semiconductor integrated circuit device. This projection of the insulator resin makes the surface of the semiconductor wafer uneven. A back grinding process performed on such a semiconductor wafer causes the following problem.

Since the insulator resin projects from the surface of the semiconductor wafer to be higher than any other component of the semiconductor integrated circuit device, when a back grinding sheet is provided on the surface of the semiconductor wafer and then the semiconductor wafer is turned upside down and is placed on the surface of the polishing table, only a portion of the insulating resin which is in contact with the polishing table serves as a point supporting the wafer. When a back grinding process is performed on the semiconductor wafer in such a state, the insulator resin is subjected to a high force, resulting in a crack in the semiconductor wafer.

In addition, with a demand for thinner semiconductor devices, the thickness of semiconductor integrated circuit devices (i.e., the thickness of a semiconductor wafer) also needs to be reduced. Specifically, it is desired to reduce the thickness of a semiconductor integrated circuit device to about 100 µm. However, as the thickness of the semiconductor integrated circuit device decreases, the ratio of the height of the insulator resin provided on the surfaces of the testing electrode terminals to the thickness of the semiconductor integrated circuit device increases. Accordingly, as the thickness of the semiconductor integrated circuit device increases, the insulator resin provided on the surfaces of the testing electrode terminals more greatly affects occurrence of a crack in the semiconductor wafer in the back grinding process.

It is therefore an object of the present disclosure to provide a semiconductor device obtained by performing a test on electrical characteristics of semiconductor integrated circuit devices on a semiconductor wafer, covering, with an insulating resin, electrode terminals of a semiconductor integrated circuit device which is determined to be defective in the test, and then performing wafer burn-in, and also provide a method for fabricating the semiconductor device. It is also an object of the present disclosure to reduce a decrease in the manufacturing yield of semiconductor devices.

A semiconductor device according to the present disclosure includes a semiconductor substrate. A semiconductor integrated circuit is formed on a center of the surface of the semiconductor substrate. A plurality of electrode terminals are formed on the surface of the semiconductor substrate. A protection film from which the surfaces of the electrode terminals are exposed is formed on the surface of the semiconductor substrate.

In a first semiconductor device according to the present disclosure, the electrode terminals include a first electrode terminal and a second electrode terminal, and a part of a surface of the first electrode terminal is lower than a surface of the second electrode terminal.

In this configuration, relatively low portions (low-lying portions) can be formed in portions of the protection film forming side walls of the openings (i.e., openings in which the surfaces of the respective electrode terminals are exposed from the protection film). Accordingly, when an insulating resin is provided on the surface of the electrode terminal having the thin portion, part of the insulating resin is allowed to flow from a location on the surface of the electrode terminal to a location on the low-lying portion of the protection film before the insulating resin dries.

Preferably, a resin film is provided on a surface of the protection film. In a configuration in which the first electrode terminal includes a thin portion and a thick portion connected to the thin portion, the thin portion is preferably located closer to the resin film than the thick portion in a direction from an edge of the surface of the semiconductor substrate toward a center thereof. This configuration can utilize affinity between the insulating resin and the resin film to allow the insulating resin to flow from a location on the surface of the electrode terminal toward the resin film.

More preferably, all portions of the surface of the first electrode terminal are lower than the surface of the second electrode terminal. This configuration can reduce the overall height of portions of the protection film forming the side walls of the openings. Accordingly, a larger amount of the insulating resin is allowed to flow from a location on the surface of the electrode terminal to a location on the surface of the low-lying portion of the protection film than in a configuration in which the electrode terminal has no thin portion.

In a preferred embodiment below, the first electrode terminal is an electrode terminal for use in burn-in.

In a second semiconductor device according to the present disclosure, a protection film has openings in which surfaces of electrode terminals are exposed, and a groove communicating with at least one of the openings is disposed in a surface of the protection film.

In this configuration, a low-lying portion can be formed in a portion of the protection film located below the groove. Accordingly, when an insulating resin is provided on the surfaces of the electrode terminals, part of the insulating resin is allowed to flow from a location on the surface of the electrode terminal to a location on the surface of the low-lying portion of the protection film before the insulating resin dries.

In a configuration in which a resin film is provided on a surface of the protection film, the groove preferably extends toward the resin film. This configuration can utilize affinity between the insulating resin and the resin film to allow the insulating resin to flow from a location on the surface of the electrode terminal to a location on the surface of the low-lying portion of the protection film.

Preferably, the groove reaches a side surface of the resin film. More preferably, a recess communicating with the groove is disposed in the side surface of the resin film.

A width of a plan view of the recess may increase from the side surface of the resin film toward an inside of the resin film. The recess may include a body portion communicating with the groove and a branch portion branching from the body portion toward an inside of the resin film. In the latter case, the insulating resin enters the recess of the resin film through capillary action.

In a preferred embodiment below, the groove communicates with the opening in which the surface of the electrode terminal for use in burn-in is exposed.

A method for fabricating a semiconductor device according to the present disclosure includes: (a) preparing a semiconductor wafer in which semiconductor integrated circuit devices each including a plurality of electrode terminals are located adjacent to one another; (b) performing a test on electrical characteristics of the semiconductor integrated circuit devices on the semiconductor wafer; (c) covering, with an insulating resin, the electrode terminals of at least one of the semiconductor integrated circuit devices whose electrical characteristics have been determined to be defective in the electrical characteristics test; (d) performing burn-in, in a batch, on the semiconductor integrated circuit devices on the semiconductor wafer after step (c); and (e) dicing the semiconductor wafer after step (d), wherein in the semiconductor wafer prepared in step (a), the electrode terminals include a first electrode terminal and a second electrode terminal, and a part of a surface of the first electrode terminal is lower than a surface of the second electrode terminal.

In this fabrication method, the electrode terminal having the thin portion is covered with the insulating resin. Thus, part of the insulating resin is allowed to flow on a location on the surface of the electrode terminal to a location on the surface of the low-lying portion of the protection film.

According to the present disclosure, a test is performed on electrical characteristics of semiconductor integrated circuit devices on a semiconductor wafer. Electrode terminals of a semiconductor integrated circuit device whose electrical characteristics have been determined to be defective is covered with an insulating resin, and then wafer burn-in is performed. As a result, in manufacturing semiconductor devices, a decrease in the manufacturing yield of semiconductor devices can be reduced.

BRIEF DESCRIPTION OF THE DRAWINGS

FIG. 1 is a cross-sectional view illustrating an example of a semiconductor device.

FIG. 2 is a top view illustrating a semiconductor integrated circuit device 1 according to a first embodiment.

FIG. 5A is a cross-sectional view showing a step of electrically insulating testing electrode terminals of a semiconductor integrated circuit device having defective electrical characteristics in a reference technique, and FIG. 5B is a cross-sectional view showing the step of electrically insulating testing electrode terminals of a semiconductor integrated circuit device having defective electrical characteristics in the first embodiment.

FIG. 6A is a cross-sectional view showing a back grinding process in a reference technique, and FIG. 6B is a cross-sectional view showing a back grinding process in the first embodiment.

DETAILED DESCRIPTION

Figure 3A:
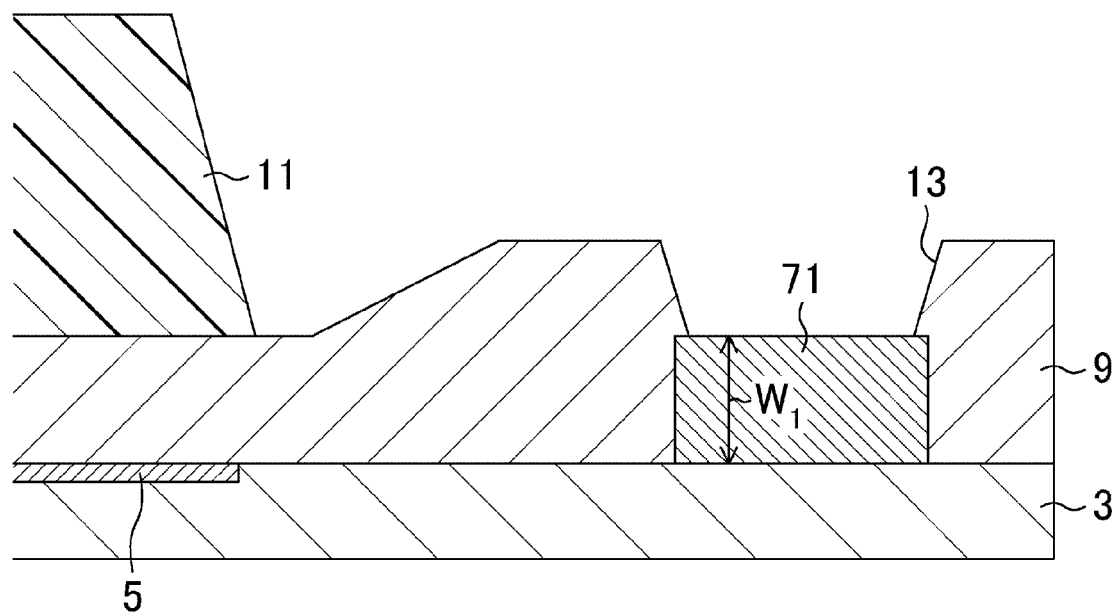
FIG. 3A is a cross-sectional view taken along line IIIA-IIIA in FIG. 2.

Prior to description of embodiments of the present disclosure, it will be described how the inventor of the present disclosure arrived at the present invention.

The inventor thought that reduction of the height (i.e., the thickness) of an insulating resin provided on the surfaces of testing electrode terminals to a value less than 10 μm (e.g., 7 μm or less) can prevent occurrence of a crack in a semiconductor wafer in a back grinding process and that even in a semiconductor integrated circuit device having a small thickness, the height of the insulating resin provided on the surfaces of the testing electrode terminals greatly affects occurrence of a crack in the semiconductor wafer in the back grinding process. Thus, the inventor studied the reason why the height of the insulating resin on the surfaces of the testing electrode terminals is about 10 μm.

In a semiconductor wafer, in general, electrode terminals are provided on the surface of a semiconductor integrated circuit device and a protection film is also provided on the semiconductor integrated circuit device. The protection film has openings in which the surfaces of the electrode terminals are exposed from the protection film.

In covering the electrode terminals of the semiconductor wafer with an insulating resin, the insulating resin is provided in the openings of the protection film. However, since the protection film forming side walls of the openings is high (i.e., has a large thickness), it is difficult for part of the insulating resin to flow from locations on the surfaces of the electrode terminals to locations on the surface of the protection film before the insulating resin dries. Accordingly, part of the insulating resin located on the surfaces of the electrode terminals becomes high. Consequently, problems such as occurrence of a crack in the semiconductor wafer in a back grinding process occur.

To prevent the problems, the inventor came up with an idea that a reduction in the height of the protection film forming side walls of the openings allows part of the insulating resin to flow from locations on the surfaces of the electrode terminals to locations on the surface of the protection film before the insulating resin dries, and arrived at the present invention.

Embodiments of the present disclosure will be described hereinafter with reference to the drawings. The present disclosure is not limited to the following embodiments. In the embodiments, like reference characters have been used to designate identical or equivalent elements, and explanation thereof is not repeated.

First Embodiment

FIG. 1 is a cross-sectional view illustrating an example of a semiconductor device according to a first embodiment.

In this embodiment, as an example of the semiconductor device, a wafer-level chip size package (hereinafter referred to as a WL-CSP) will be described. The configuration of the WL-CSP will be briefly described hereinafter. The surface of a semiconductor integrated circuit device 1 on which electrode terminals 71, 73, . . . are provided is encapsulated with an encapsulating resin 101. Each of the electrode terminals 71 and 73 is electrically connected to a redistribution layer 107. Bump electrodes 103, 103, . . . penetrate the encapsulating resin 101 along the thickness thereof. Solder balls 105 are provided on portions of the bump electrodes 103 exposed from the encapsulating resin 101. The electrode terminals 71 and 73 of the semiconductor integrated circuit device 1 are electrically connected to the solder balls 105 through the redistribution layer 107 and the bump electrodes 103.

FIG. 2 is a top view illustrating the semiconductor integrated circuit device 1 of this embodiment.

The semiconductor integrated circuit device 1 of this embodiment includes a semiconductor substrate 3. A semiconductor integrated circuit 5 is formed on a center of the surface of the semiconductor substrate 3. The electrode terminals 71, 73, . . . are formed on an edge of the surface of the semiconductor substrate 3 such that the electrode terminals 71 and 73 are spaced apart from each other. Each of the electrode terminals 71 and 73 is electrically connected to the semiconductor integrated circuit 5. A protection film 9 is provided on the surface of the above-described semiconductor substrate 3, and has a plurality of openings in which the surfaces of the electrode terminals 71 and 73 are exposed. A resin film 11 is provided on a portion of the surface of the protection film 9 located on the semiconductor integrated circuit 5, and has the function of protecting the semiconductor integrated circuit 5. Each of the electrode terminals 71 and 73 is preferably made of, for example, Al. The protection film 9 is preferably made of, for example, SiN, and has a thickness of 1 μm or less (e.g., 850 nm). The resin film 11 is preferably made of, for example, polybenzoxazole, and has a thickness of about 4 μm.

Figure 3B:
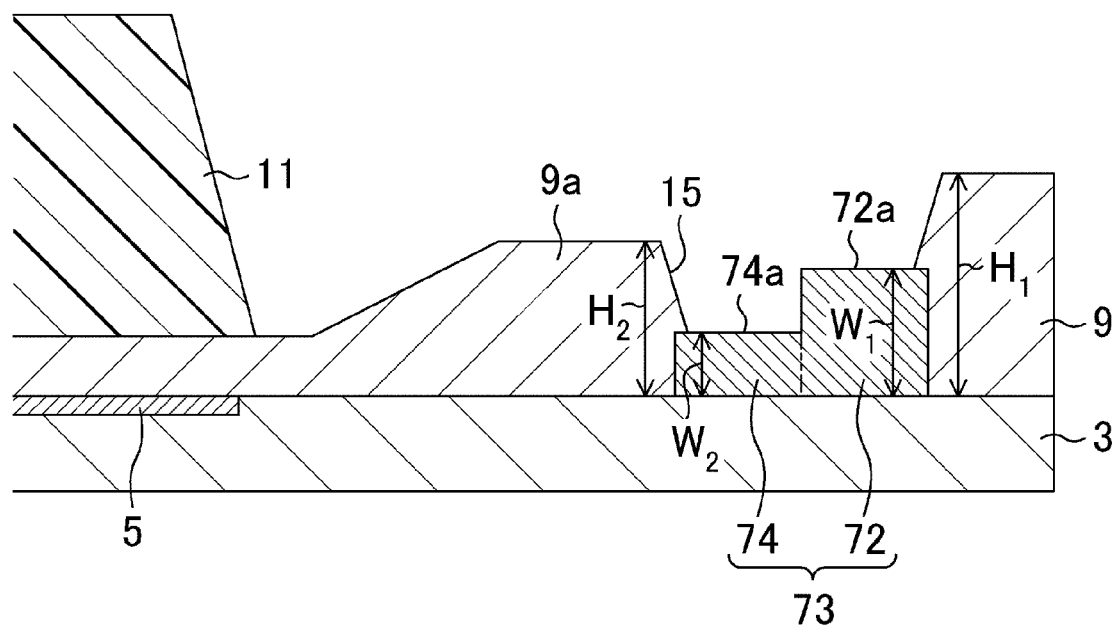
FIG. 3B is a cross-sectional view taken along line IIIB-IIIB in FIG. 2.

FIG. 3A is a cross-sectional view taken along line IIIA-IIIA in FIG. 2. FIG. 3B is a cross-sectional view taken along line IIIB-IIIB in FIG. 2.

The electrode terminals 71, 73, . . . of this embodiment include connection electrode terminals 71, 71, . . . illustrated in FIG. 3A and testing electrode terminals 73, 73, . . . illustrated in FIG. 3B.

Each of the connection electrode terminals 71 is an electrode terminal electrically connected to an electrode provided on, for example, a circuit board (i.e., a board to which the semiconductor device is electrically connected). Each of the connection electrode terminals 71 has a thickness $W_1$, and the surfaces of the connection electrode terminals 71 are flush with one another. Accordingly, the height of the surface of the protection film 9 forming the side wall of each opening 13 (in which the surface of an associated one of the connection electrode terminals 71 is exposed) is uniform, irrespective of the location thereof.

Each of the testing electrode terminals 73 is an electrode terminal for use in a burn-in test, and has a thick portion 72 (with a thickness $W_1$) and a thin portion 74 (with a thickness $W_2$ ($<W_1$)). In each of the testing electrode terminals 73, the thin portion 74 is located closer to the resin film 11 than the thick portion 72 along a direction from the edge of the surface of the semiconductor substrate 3 to the center thereof (i.e., the lateral direction in FIG. 2, hereinafter referred to as a "first direction"). The surface 74a of the thin portion 74 is located below (i.e., closer to the surface of the semiconductor substrate 3 than) the surface 72a of the thick portion 72. Accordingly, in the protection film 9 forming the side walls of the openings 15 (in which the surfaces of the testing electrode terminals 73 are exposed), the height ($H_2$) of a portion connected to the surface 74a of the thin portion 74 is smaller than the height ($H_1$) of a portion connected to the surface 72a of the thick portion 72. That is, a portion of the protection film 9 forming the side wall of each of the opening 15 has a relatively low portion (hereinafter referred to as a "low-lying portion") 9a, which extends from the opening 15 toward the resin film 11.

The thickness ($W_2$) of the thin portion 74 is ⅚ or less of the thickness ($W_1$) of the thick portion 72 (or the connection electrode terminals 71), is preferably in the range from ⅜ to ⅚, both inclusive, of the thickness ($W_1$) of the thick portion 72 (or the connection electrode terminals 71), and is more preferably ½ of the thickness ($W_1$) of the thick portion 72 (or the connection electrode terminals 71). In general, the thickness ($W_1$) of the connection electrode terminals 71 is 1200 nm. In this case, the thickness ($W_1$) of the thick portion 72 is 1200 nm, and the thickness ($W_2$) of the thin portion 74 only needs to be 1000 nm or less, and is preferably in the range from 450 nm to 1000 nm, both inclusive, and is more preferably 600 nm.

Figure 4:
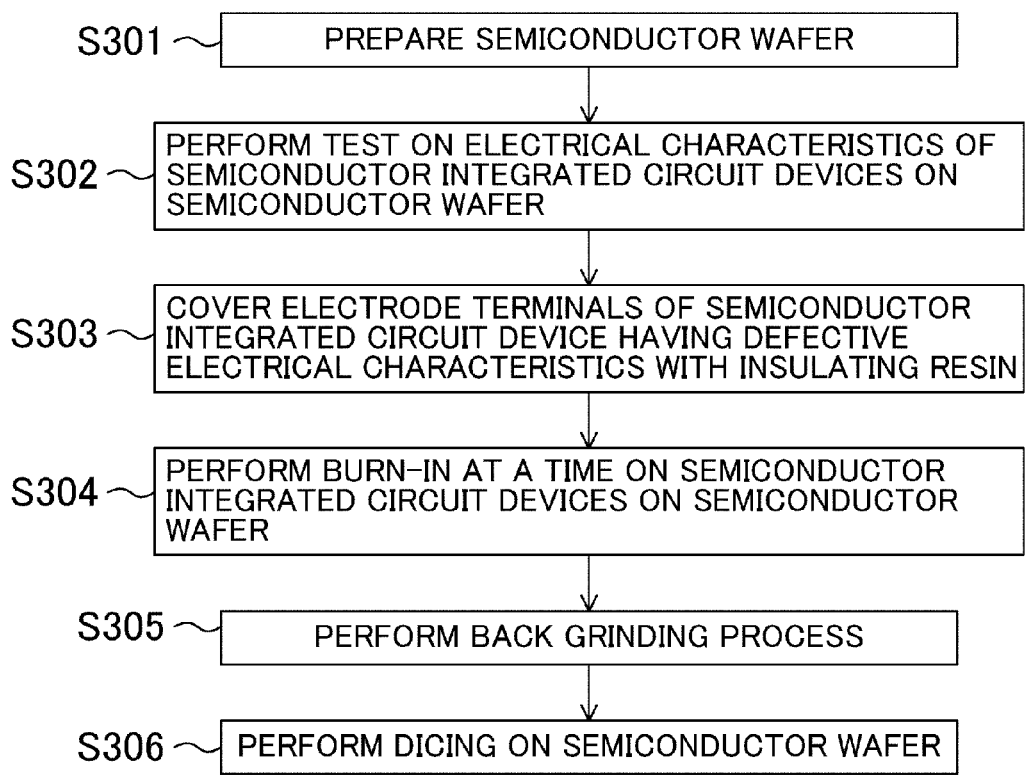
FIG. 4 is a flowchart showing a method for fabricating a semiconductor device according to the first embodiment.

FIG. 4 is a flowchart showing a method for fabricating a semiconductor device according to this embodiment. In this embodiment, the step of electrically insulating testing electrode terminals of a semiconductor integrated circuit device having defective electrical characteristics and a back grinding process will be described with comparison to a reference technique. FIGS. 5A and 5B are cross-sectional views showing a step of electrically insulating testing electrode terminals of a semiconductor integrated circuit device having defective electrical characteristics in a reference technique and this embodiment, respectively. FIGS. 6A and 6B are cross-sectional views showing a back grinding process in a reference technique and this embodiment, respectively.

In FIGS. 5A and 6A, a semiconductor integrated circuit device showing defective electrical characteristics, a connection electrode terminal thereof, and a testing electrode terminal thereof are denoted by 901A, 971A, and 973A, respectively, and a semiconductor integrated circuit device showing good electrical characteristics, a connection electrode terminal thereof, and a testing electrode terminal thereof are denoted by 901B, 971B, and 973B, respectively. In the same manner, in FIGS. 5B and 6B, a semiconductor integrated circuit device showing defective electrical characteristics, a connection electrode terminal thereof, and a testing electrode terminal thereof are denoted by 1A, 71A, and 73A, respectively, and a semiconductor integrated circuit device showing good electrical characteristics, a connection electrode terminal thereof, and a testing electrode terminal thereof are denoted by 1B, 71B, and 73B.

First, in step S301, a semiconductor wafer in which a plurality of regions are defined by dicing lines is prepared, and a semiconductor integrated circuit device 1 is formed on each of the regions (step (a)). Specifically, a semiconductor integrated circuit 5 is formed on the center of each of the regions. Then, a film made of an electrode material is formed over the entire surface of the semiconductor wafer, and is then etched. Accordingly, a plurality of electrode terminals having an identical thickness are formed on an edge portion of each of the regions such that the electrode terminals are located apart from each other. Subsequently, part of the electrode terminals to serve as testing electrode terminals 73 is further etched. At this time, part of the surfaces of the electrode terminals to serve as testing electrode terminals 73 located close to the semiconductor integrated circuit 5 is etched. In this manner, testing electrode terminals 73 having thin portions 74 are formed. Thereafter, a film to be a protection film 9 is formed on the surface of the semiconductor wafer, and then a resin film 11 is formed on a portion of the surface of the film to be a protection film 9 located on the semiconductor integrated circuit 5.

Next, in step S302, a test is performed on electrical characteristics of each of the semiconductor integrated circuit devices 1 on the semiconductor wafer (step (b)). Then, in step S303, an insulating resin 17 is provided on the surfaces of testing electrode terminals 73A of a semiconductor integrated circuit device 1A whose electrical characteristics have been determined to be defective, whereas no insulating resin 17 is provided on the surfaces of testing electrode terminals 73B of a semiconductor integrated circuit device 1B whose electrical characteristics have been determined to be good (step (c)). The insulating resin 17 is a resin having no conductivity, and preferably has a high volumetric shrinkage percentage in drying after application. Examples of the insulating resin 17 include an acrylic resin, a polyimide resin, and an epoxy resin. In this manner, it is possible to electrically insulate only the testing electrode terminals 73A of the semiconductor integrated circuit device 1A whose electrical characteristics have been determined to be defective.

At this time, the testing electrode terminals 973A and 973B of the reference technique have no thin portions, and thus the protection film 909 has no low-lying portions. Accordingly, if an insulating resin 917 is provided on the surfaces of the testing electrode terminals 973A of the semiconductor integrated circuit device 901A having defective electrical characteristics, most part of the insulating resin 917 does not flow to locations on the surface of the protection film 9, and dries on the surfaces of the testing electrode terminals 973A. As a result, the insulating resin 917 becomes high, and has a height of, for example, about 10 μm. Considering that the thickness of the protection film 909 is 1 μm or less and the thickness of the resin film 911 is about 4 μm, the insulating resin 917 projects to a height of 5 μm or more from the surface of the resin film 911.

On the other hand, in this embodiment, since the testing electrode terminals 73A and 73B have thin portions 74, the protection film 9 forming the side walls of the openings 15 has low-lying portions 9a. Accordingly, when the insulating resin 17 is provided on the surfaces of the testing electrode terminals 73A of the semiconductor integrated circuit device 1A having defective electrical characteristics, part of the insulating resin 17 flows from locations on the surfaces of the testing electrode terminals 73A to locations on the surfaces of the low-lying portions 9a before drying. Through this process, the height of the insulating resin 17 on the surfaces of the testing electrode terminals 73A can be made smaller than that in the reference technique, and can be 4 μm to 7 μm, for example. As a result, the insulating resin 17 projects from the surface of the resin film 11 to be slightly higher than the surface of the resin film 11, or is lower than the surface of the resin film 11.

In this embodiment, since the thin portion 74 is located closer to the resin film 11 than the thick portion 72 in the first direction, the low-lying portion 9a of the protection film 9 extends from the opening 15 toward the resin film 11. Accordingly, when the insulating resin 17 is provided on the surfaces of the testing electrode terminals 73A of the semiconductor integrated circuit device 1A having defective electrical characteristics, part of the insulating resin 17 is allowed to flow from the surfaces of the testing electrode terminals 73A to locations on the surfaces of the low-lying portions 9a to reach the resin film 11 before drying. When the insulating resin 17 comes into contact with the resin film 11, affinity between the resin film 11 and the insulating resin 17 enables a larger amount of the insulating resin 17 to flow from locations on the surfaces of the testing electrode terminals 73A to the resin film 11 before drying. Accordingly, in the configuration in which the thin portion 74 is located closer to the resin film 11 than the thick portion 72 in the first direction as in this embodiment, the height of the insulating resin 17 on the surfaces of the testing electrode terminals 73A can be reduced, as compared to a configuration in which the thin portion 74 is provided at another location.

Then, in step S304, burn-in is performed on a plurality of semiconductor integrated circuit devices in a batch (step (d)). With this process, the cost for burn-in can be reduced, as compared to a case where the semiconductor wafer is divided and then burn-in is individually performed on each of the semiconductor integrated circuit devices. In addition, no burn-in is performed on a semiconductor integrated circuit device whose electrical characteristics have been determined to be defective. Thus, electrical damage on a probe card in burn-in can be reduced.

Subsequently, in step S305, a back grinding process is performed. Specifically, a semiconductor wafer 19 is turned upside down, and is then placed on the surface of a polishing table 21 so that the bottom surface of the semiconductor wafer 19 is polished with, for example, a grindstone.

At this time, since the testing electrode terminals 973A and 973B have no thin portions in the reference technique, the insulating resin 917 projects from the surface of the resin film 11 to be as high as 5 μm or more. Accordingly, when a back grinding sheet 1000 is provided on the surface of a semiconductor wafer 919, and then the semiconductor wafer 919 is turned upside down so that the semiconductor wafer 919 is placed on the surface of a polishing table 921, only part of the insulating resin 917 in contact with the polishing table 921 serves as a point supporting the wafer. The surface (i.e., the surface facing downward in FIG. 6A) of the resin film 911 is located at a height of 5 μm or more from the surface of the polishing table 921. When a back grinding process is performed on a semiconductor wafer in this state, the insulating resin 917 is subjected to a high force. As a result, a crack occurs in the semiconductor wafer 919.

On the other hand, in this embodiment, since each of the testing electrode terminals 73 has the thin portion 74, the insulating resin 17 projects from the surface of the resin film 11 to be slightly higher than the surface of the resin film 11. Accordingly, when a back grinding sheet 100 is provided on the surface of the semiconductor wafer 19 and then the semiconductor wafer 19 is turned upside down so that the semiconductor wafer 19 is placed on the surface of the polishing table 21, the distance between the surface (i.e., the surface facing downward in FIG. 6B) of the resin film 11 and the surface of the polishing table 21 can be made smaller than that in the reference technique. This configuration can reduce a shake of the semiconductor wafer 19 on the polishing table 21 so that the semiconductor wafer 19 can be stably placed on the polishing table 21. As a result, the insulating resin 17 is not subjected to an extremely high force during polishing, thereby reducing occurrence of a crack in the semiconductor wafer 19.

Thereafter, the semiconductor wafer 19 is turned upside down. Then, with known methods, formation of a redistribution layer 107, formation of an encapsulating resin 101, formation of bump electrodes 103, and placement of solder balls 105 are performed. In this manner, a semiconductor device can be fabricated on each region.

Then, in step S306, the semiconductor wafer 19 is divided along the dicing lines (step (e)). In this manner, a semiconductor device according to this embodiment can be fabricated.

Figure 7A:
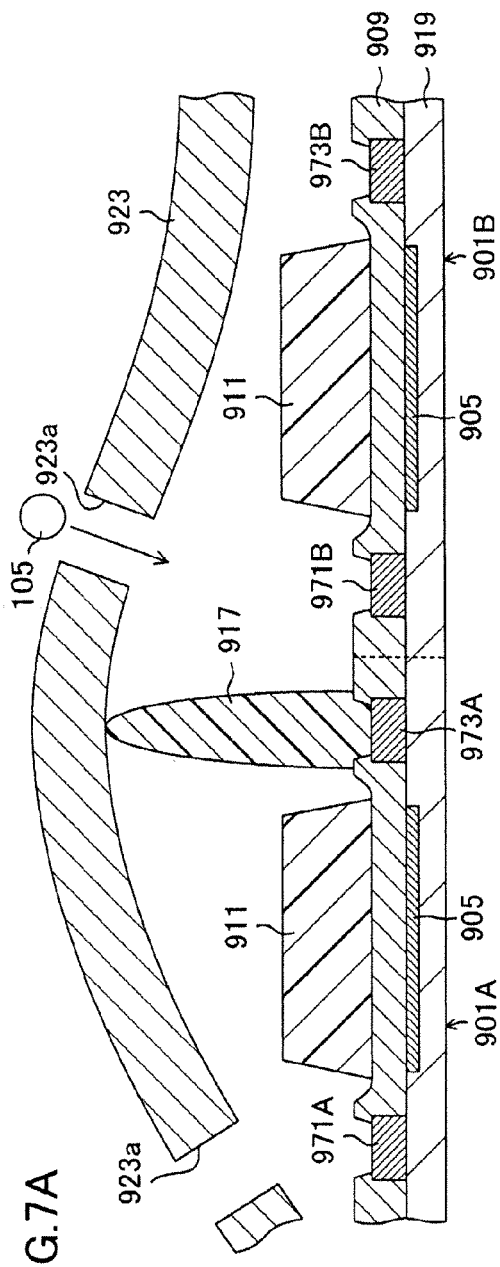
FIG. 7A is a cross-sectional view showing a method for placing solder balls on the surfaces of connection electrode terminals in a reference technique.
Figure 7B:
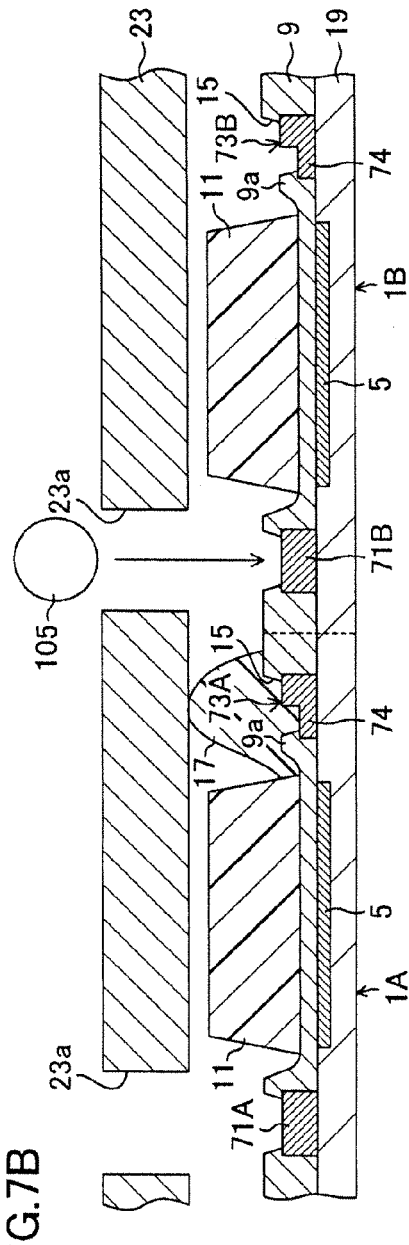
FIG. 7B is a cross-sectional view showing a method for placing solder balls on the surfaces of connection electrode terminals in the first embodiment.

In FIG. 1, the solder balls 105 are provided on portions of the bump electrodes 103 exposed from the encapsulating resin 101, but in some cases, are provided on the surfaces of the connection electrode terminals. In this case, the solder balls are placed on the surfaces of the connection electrode terminals in the following manner. FIGS. 7A and 7B are cross-sectional views showing a method for placing solder balls on the surfaces of connection electrode terminals in a reference technique and this embodiment, respectively. In FIG. 7A, a semiconductor integrated circuit device having defective electrical characteristics, a connection electrode terminal thereof, and a testing electrode terminal thereof are denoted by 901A, 971A, and 973A, respectively, and a semiconductor integrated circuit device having good electrical characteristics, a connection electrode terminal thereof, and a testing electrode terminal thereof are denoted by 901B, 971B, and 973B, respectively. In FIG. 7B, a semiconductor integrated circuit device having defective electrical characteristics, a connection electrode terminal thereof, and a testing electrode terminal thereof are denoted by 1A, 71A, and 73A, respectively, and a semiconductor integrated circuit device having good electrical characteristics, a connection electrode terminal thereof, and a testing electrode terminal thereof are denoted by 1B, 71B, and 73B, respectively.

First, a metal mask 23 is placed on the surface of the semiconductor wafer 19. The metal mask 23 has a plurality of holes 23a, 23a, ..., in which the surfaces of the connection electrode terminals are respectively exposed. Then, solder balls 105 are placed on the respective holes 23a, and then the metal mask 23 is removed. In this manner, the solder balls can be connected to the surfaces of the connection electrode terminals.

At this time, in the reference technique, since the testing electrode terminals 973A and 973B have no thin portions, the insulating resin 917 projects from the surface of the resin film 11 to be as high as 5 μm or more. Accordingly, in placing a metal mask 923 on the surface of the semiconductor wafer 919, the metal mask 923 cannot be stably placed on the surface of the semiconductor wafer 919. In other words, the metal mask 923 cannot be placed on the semiconductor wafer 919 in such a manner that holes 923a are located on the respective surfaces of connection electrode terminals 971B of the semiconductor integrated circuit device 901B having good electrical characteristics. Consequently, the connection positions of the solder balls 105 shift from the surfaces of the connection electrode terminals 971B of the semiconductor integrated circuit device 901B having good electrical characteristics.

In addition, in the reference technique, when the metal mask 923 is placed on the surface of the semiconductor wafer 919 such that the holes 923a are located on the respective surfaces of the connection electrode terminals 971B of the semiconductor integrated circuit device 901B, the metal mask 923 is crushed by the insulating resin 917 on the surfaces of the testing electrode terminals 973A.

On the other hand, in this embodiment, since the testing electrode terminals 73A and 73B have thin portions 74, the insulating resin 17 projects from the surface of the resin film 11 to be slightly higher than the surface of the resin film 11. Accordingly, in placing the metal mask 23 on the surface of the semiconductor wafer 19, the metal mask 23 can be stably placed on the surface of the semiconductor wafer 19. Specifically, the metal mask 23 can be placed on the surface of the semiconductor wafer 19 such that the holes 23a are located on the respective surfaces of the connection electrode terminals 71B of the semiconductor integrated circuit device 1B having good electrical characteristics. In this manner, the solder balls 105 can be connected to the surfaces of the connection electrode terminals 71B of the semiconductor integrated circuit device 1B having good electrical characteristics.

In addition, in this embodiment, the height of the insulating resin 17 on the surfaces of the testing electrode terminals 73A can be reduced than that in the reference technique. Accordingly, the metal mask 23 can be placed on the surface of the semiconductor wafer 19 such that the holes 23a are located on the respective surfaces of the connection electrode terminals 71B of the semiconductor integrated circuit device 1B having good electrical characteristics without a crush of the metal mask 23.

In summary, fabrication of semiconductor devices according to the above-described method using the semiconductor wafer 19 provided with a plurality of semiconductor integrated circuit devices including the testing electrode terminals 73 allows the height of the insulating resin 17 on the surfaces of the testing electrode terminals 73A of the semiconductor integrated circuit device 1A having defective electrical characteristics to be smaller than that in the reference technique. Accordingly, occurrence of a crack in the semiconductor wafer 19 in the back grinding process can be reduced. In placing the solder balls 105 on the surfaces of the connection electrode terminals 71, the solder balls 105 can be placed without being shifted from the surfaces of the connection electrode terminals 71. In this case, the solder balls 105 can be placed without a crush of the metal mask 23. As a result, in this embodiment, the manufacturing yield of semiconductor devices can be increased, as compared to the reference technique.

In each of the testing electrode terminals 73 of this embodiment, the thin portion 74 is located closer to the resin film 11 than the thick portion 72 in the first direction. Accordingly, fabrication of semiconductor devices according to the above-described method using the semiconductor wafer 19 provided with a plurality of semiconductor integrated circuit devices including the testing electrode terminals 73 in this embodiment allows the height of the insulating resin 17 on the surfaces of the testing electrode terminals 73A of the semiconductor integrated circuit device 1A having defective electrical characteristics to be smaller than that in a configuration in which the thin portion 74 is located at a position different from that in this embodiment. Accordingly, in this embodiment, the manufacturing yield of semiconductor devices can be increased, as compared to the case where the thin portion 74 is located at a position different from that in this embodiment.

This embodiment may have the following configuration.

The thin portions of the testing electrode terminals may be provided at positions shown in the following first to fourth variations. The connection electrode terminals and the testing electrode terminals may be connection electrode terminals and testing electrode terminals, respectively, in a fifth variation which will be described below. In any of the cases, since the testing electrode terminals have thin portions, the height of the insulating resin on the surfaces of the testing electrode terminals can be smaller than that in a configuration in which the insulating resin is placed on the surfaces of testing electrode terminals having no thin portions. However, comparison among thin portions of this embodiment, the first variation, and the second variation shows that the configuration in which the thin portion is located closer to the resin film than the thick portion in the first direction as in this embodiment can utilize affinity between the resin film and the insulating resin to allow a larger amount of the insulating resin to flow from locations on the surfaces of the testing electrode terminals to locations on the surfaces of the resin film. Accordingly, in this embodiment, the advantage of reducing the height of the insulating resin on the surfaces of the testing electrode terminals can be obtained more effectively than in the first and second variations below.

In this embodiment, the testing electrode terminals and the connection electrode terminals are provided as different components. Alternatively, an electrode terminal may serve as both a testing electrode terminal and a connection electrode terminal. In the case where an electrode terminal serves as both a testing electrode terminal and a connection electrode terminal, all the electrode terminals preferably have the configurations of the connection electrode terminals of this embodiment. The same holds in the first to sixth variations.

In this embodiment, the configuration of the WL-CSP is, of course, not limited to the configuration illustrated in FIG. 1.

The semiconductor device of this embodiment may be a ball grid array package (hereinafter referred to as a BGA) as shown in the sixth variation below. However, the WL-CSP can obtain the advantage of placing solder balls on the surfaces of the connection electrode terminals without shifts, in addition to the advantage of reducing occurrence of a crack in the semiconductor wafer in the back grinding process.

In this embodiment, only examples of the electrode terminals (i.e., the connection electrode terminals and the testing electrode terminals), the protection film, and the material for the resin film are described, and the thicknesses of these components are not limited to the examples described above. The numbers of the connection electrode terminals, the testing electrode terminals, and the electrode terminals are not limited to the numbers shown in FIG. 2, and the positions thereof are not limited to those shown in FIG. 2. Although the configuration of the semiconductor integrated circuit is not shown, the configuration may be a known configuration. The same holds in the first to sixth variations, a second embodiment, and seventh to eleventh variations below.

(First Variation)

Figure 8A:
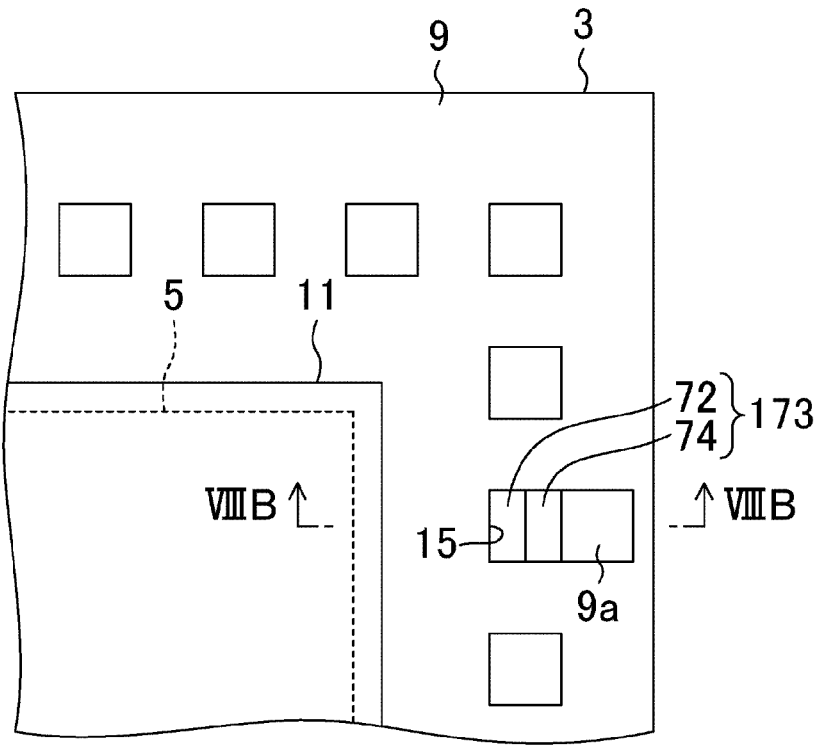
FIG. 8A is a top view illustrating a main portion of a semiconductor integrated circuit device according to a first variation.
Figure 8B:
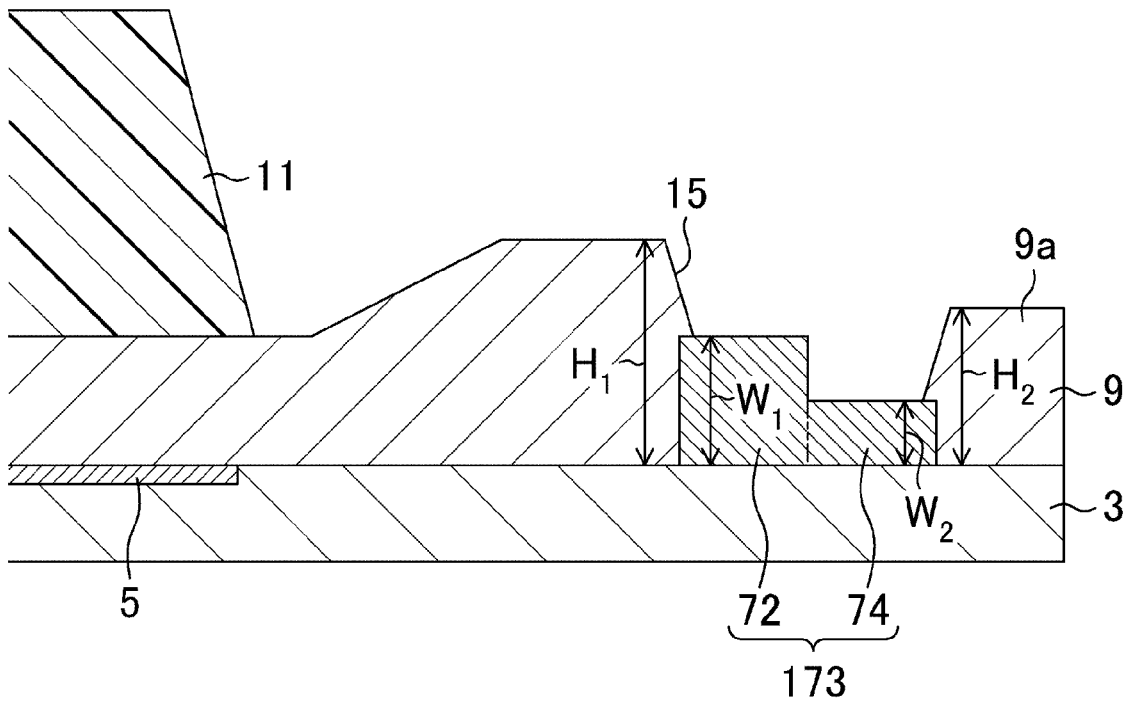
FIG. 8B is a cross-sectional view taken along line VIIIB-VIIIB in FIG. 8A.

FIG. 8A is a top view illustrating a main portion of a semiconductor integrated circuit device according to a first variation. FIG. 8B is a cross-sectional view taken along line VIIIB-VIIIB in FIG. 8A. The positions of the thin portions in this variation differ from those in the first embodiment. The following description is mainly given on aspects different from those in the first embodiment.

In each of testing electrode terminal 173 of this variation, the thin portion 74 is located closer to the edge of the surface of the semiconductor substrate 3 than the thick portion 72 in the first direction. Accordingly, each of the low-lying portions 9a of the protection film 9 of this variation extends from the opening 15 toward the edge of the semiconductor substrate 3.

When the insulating resin is provided on the surfaces of the testing electrode terminals 173 described above, part of the insulating resin flows on the surfaces of the low-lying portions 9a of the protection film 9 from locations on the surfaces of the testing electrode terminals 173 toward the edge of the semiconductor substrate 3 before drying. Accordingly, fabrication of semiconductor devices according to the first embodiment using the semiconductor wafer provided with a plurality of semiconductor integrated circuit devices including the testing electrode terminals 173 in this variation allows the height of the insulating resin on the surfaces of the testing electrode terminals of the semiconductor integrated circuit device having defective electrical characteristics to be smaller than that in a reference technique. As a result, as described in the first embodiment, the manufacturing yield of semiconductor devices can be increased in this variation.

(Second Variation)

Figure 9A:
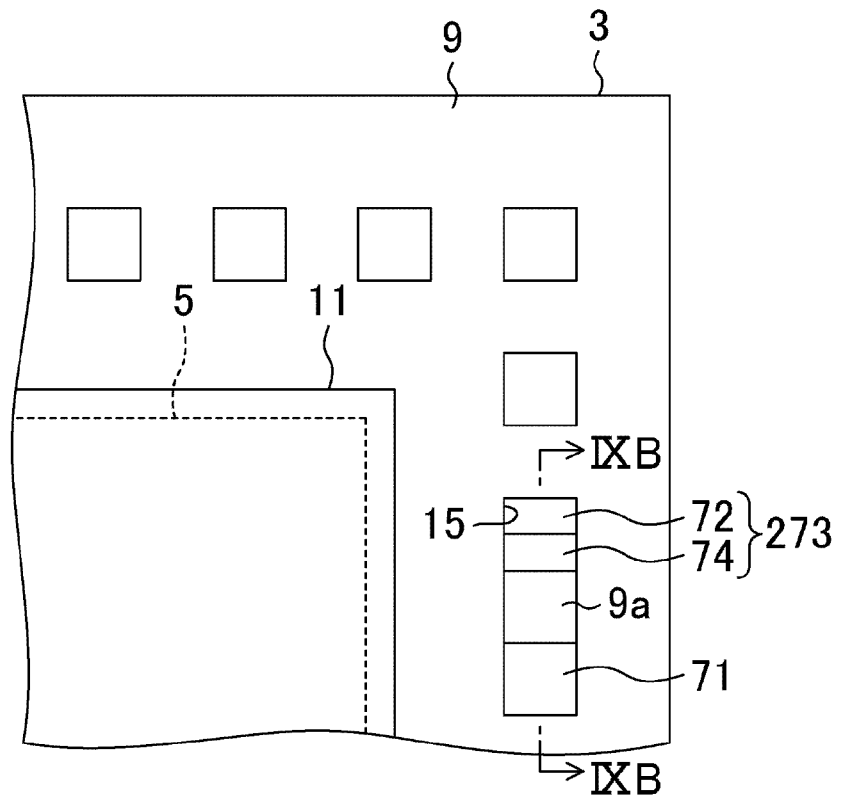
FIG. 9A is a top view illustrating a main portion of a semiconductor integrated circuit device according to a second variation.
Figure 9B:
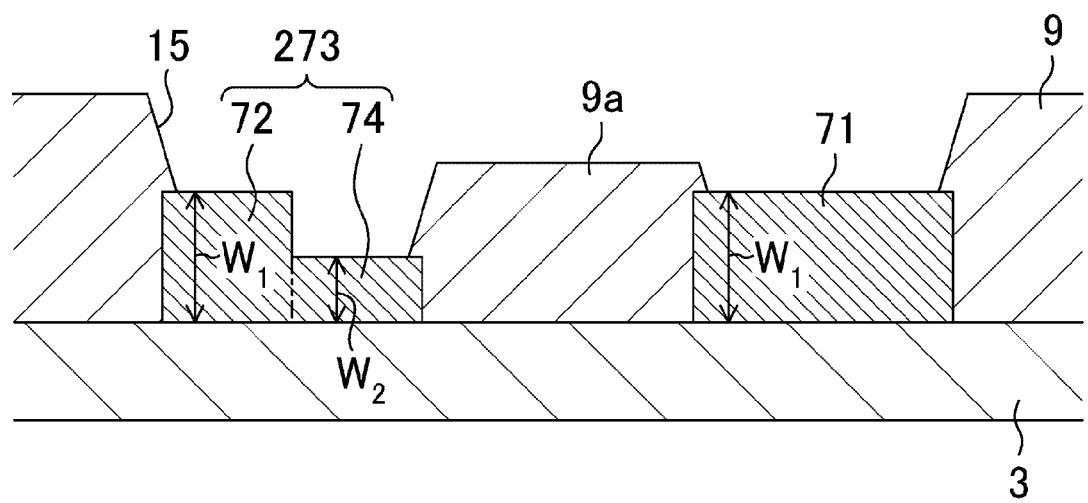
FIG. 9B is a cross-sectional view taken along line IXB-IXB in FIG. 9A.

FIG. 9A is a top view illustrating a main portion of a semiconductor integrated circuit device according to a second variation. FIG. 9B is a cross-sectional view taken along line IXB-IXB in FIG. 9A. The positions of the thin portions in this variation differ from those in the first embodiment. The following description is mainly given on aspects different from those in the first embodiment.

In each of testing electrode terminals 273 of this variation, the thick portion 72 is located closer to an electrode terminal adjacent to this testing electrode terminal 273 at one side than the thin portion 74, and the thin portion 74 is located closer to an electrode terminal (shown as a connection electrode terminal 71 in FIGS. 9A and 9B as an example) adjacent to this testing electrode terminal 273 at an opposite side than the thick portion 72. Accordingly, the low-lying portion 9a of the protection film 9 of this variation extends from the opening 15 to the electrode terminal adjacent to the testing electrode terminals 273.

When the insulating resin is provided on the surfaces of the testing electrode terminals 273 as described above, part of the insulating resin flows on the surface of the low-lying portions 9a of the protection film 9 from locations on the surfaces of the testing electrode terminals 273 toward the electrode terminals adjacent to the testing electrode terminals 273 before drying. Accordingly, fabrication of semiconductor devices according to the first embodiment using the semiconductor wafer provided with a plurality of semiconductor integrated circuit devices including the testing electrode terminals 273 in this variation allows the height of the insulating resin on the surfaces of the testing electrode terminals of the semiconductor integrated circuit device having defective electrical characteristics to be smaller than that in a reference technique. As a result, as described in the first embodiment, the manufacturing yield of semiconductor devices can be increased in this variation.

(Third Variation)

Figure 10A:
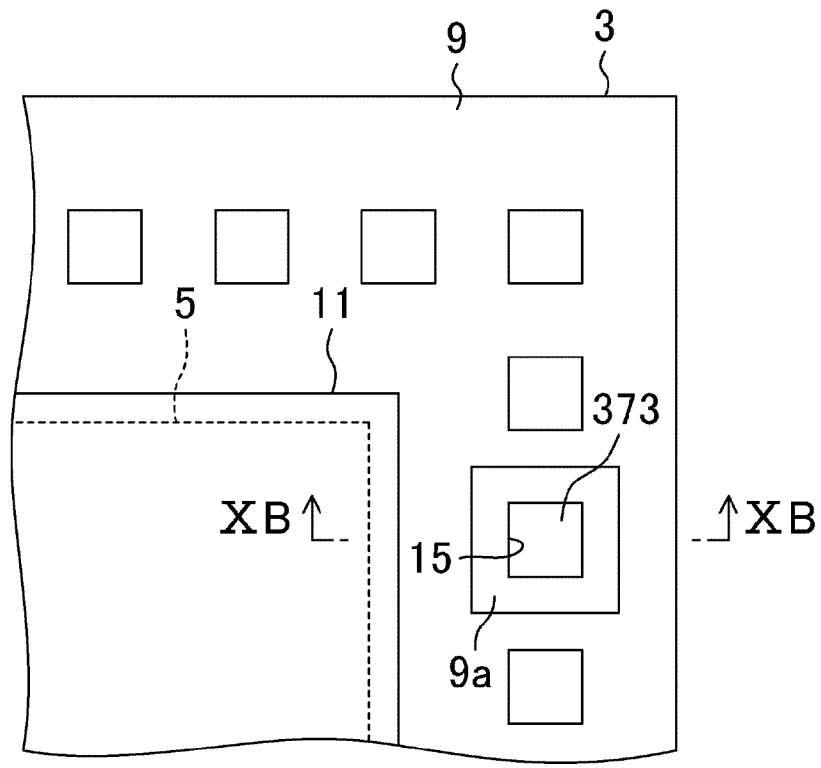
FIG. 10A is a top view illustrating a main portion of a semiconductor integrated circuit device according to a third variation.
Figure 10B:
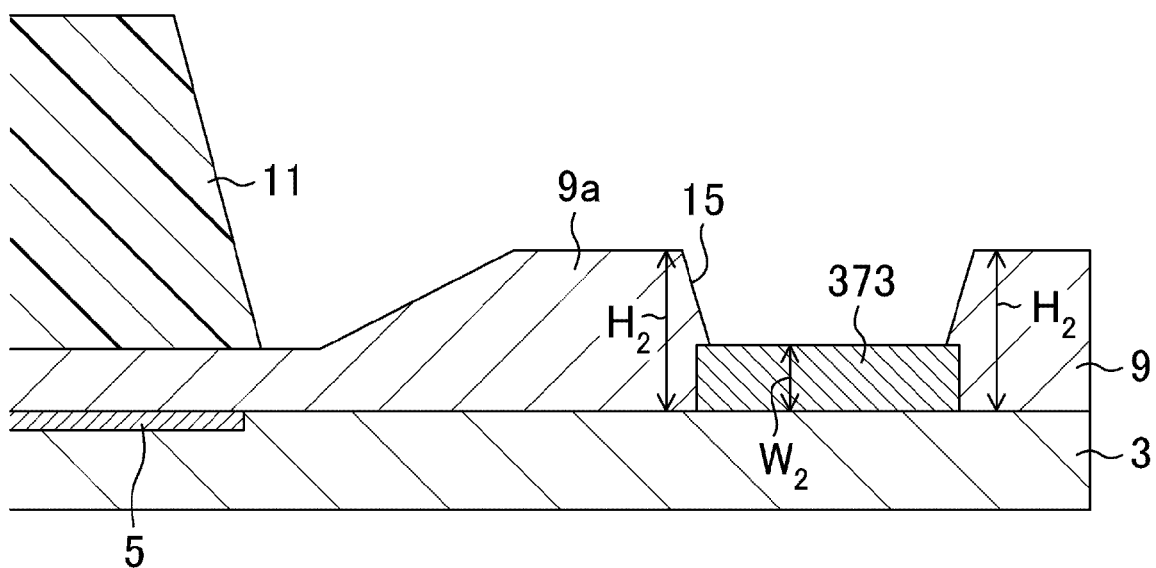
FIG. 10B is a cross-sectional view taken along line XB-XB in FIG. 10A.

FIG. 10A is a top view illustrating a main portion of a semiconductor integrated circuit device according to a third variation. FIG. 10B is a cross-sectional view taken along line XB-XB in FIG. 10A. The positions of the thin portions in this variation differ from those in the first embodiment. The following description is mainly given on aspects different from those in the first embodiment.

Each of testing electrode terminals 373 of this variation is made of a thin portion. Accordingly, each of the low-lying portions 9a of the protection film 9 of this variation is formed to surround an associated one of the testing electrode terminals 373. In other words, in this variation, the protection film 9 forming side walls of the openings 15 is lower than that in a reference technique.

When the insulating resin is provided on the surfaces of the testing electrode terminals 373 as described above, part of the insulating resin not only flows on the surfaces of the low-lying portions 9a of the protection film 9 from locations on the surfaces of the testing electrode terminals 373 toward the resin film 11, but also flows on the surfaces of the low-lying portions 9a of the protection film 9 from locations on the surfaces of the testing electrode terminals 373 toward the edge of the semiconductor substrate 3, and also flows on the surfaces of the low-lying portions 9a of the protection film 9 from locations on the surfaces of the testing electrode terminals 373 toward electrode terminals at both sides of the testing electrode terminal 373, before drying. Accordingly, fabrication of semiconductor devices according to the first embodiment using the semiconductor wafer provided with a plurality of semiconductor integrated circuit devices including the testing electrode terminals 373 in this variation allows the height of the insulating resin on the surfaces of the testing electrode terminals of the semiconductor integrated circuit device having defective electrical characteristics to be smaller than that in the first embodiment. As a result, in this variation, the manufacturing yield of semiconductor devices can be increased, as compared to the first embodiment.

(Fourth Variation)

Figure 11A:
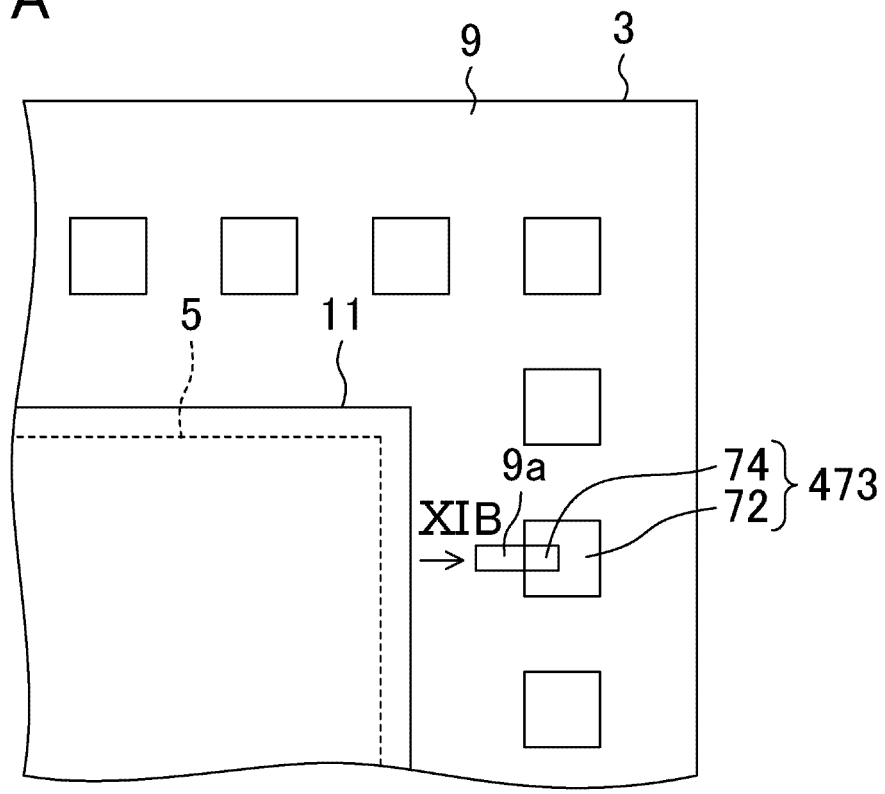
FIG. 11A is a top view illustrating a main portion of a semiconductor integrated circuit device according to a fourth variation.
Figure 11B:
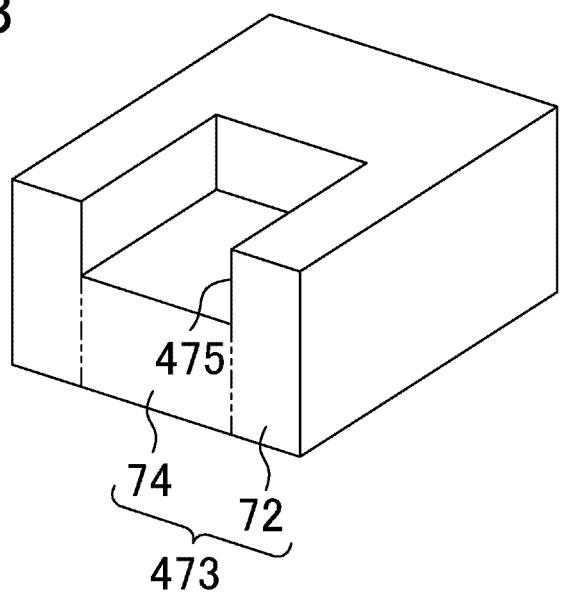
FIG. 11B is a perspective view when viewed from XIB in FIG. 11A.

FIG. 11A is a top view illustrating a main portion of a semiconductor integrated circuit device according to a fourth variation. FIG. 11B is a perspective view when viewed from XIB in FIG. 11A. The positions of the thin portions in this variation differ from those in the first embodiment. The following description is mainly given on aspects different from those in the first embodiment.

In each of testing electrode terminals 473 of this variation, the thin portion 74 is located closer to the resin film 11 than the thick portion 72 in the first direction, and in addition, is provided in a portion in the direction (i.e., the longitudinal direction of FIG. 11A) perpendicular to the first direction. In other words, a recess 475 extending toward the resin film 11 is formed in the surface of each of the testing electrode terminals 473 of this variation. The thin portion 74 is part of the testing electrode terminal 473 located under the recess 475. In this configuration, as in the first embodiment, the low-lying portion 9a of the protection film 9 extends from the opening toward the resin film 11.

When the insulating resin is provided on the surfaces of the testing electrode terminals 473 as described above, part of the insulating resin flows on the surfaces of the low-lying portions 9a of the protection film 9 from locations on the surfaces of the testing electrode terminals 473 toward the resin film 11 before drying. Accordingly, fabrication of semiconductor devices according to the first embodiment using the semiconductor wafer provided with a plurality of semiconductor integrated circuit devices including the testing electrode terminals 473 in this variation allows the height of the insulating resin on the surfaces of the testing electrode terminals of the semiconductor integrated circuit device having defective electrical characteristics to be smaller than that in a reference technique. As a result, as described in the first embodiment, the manufacturing yield of semiconductor devices can be increased in this variation, as compared to the reference technique.

This variation is applicable to the first and second variations. That is, the thin portion of the first variation may be formed only in a portion in the direction perpendicular to the first direction, or the thin portion of the second variation may be formed only in a portion in the first direction.

(Fifth Variation)

Figure 12A:
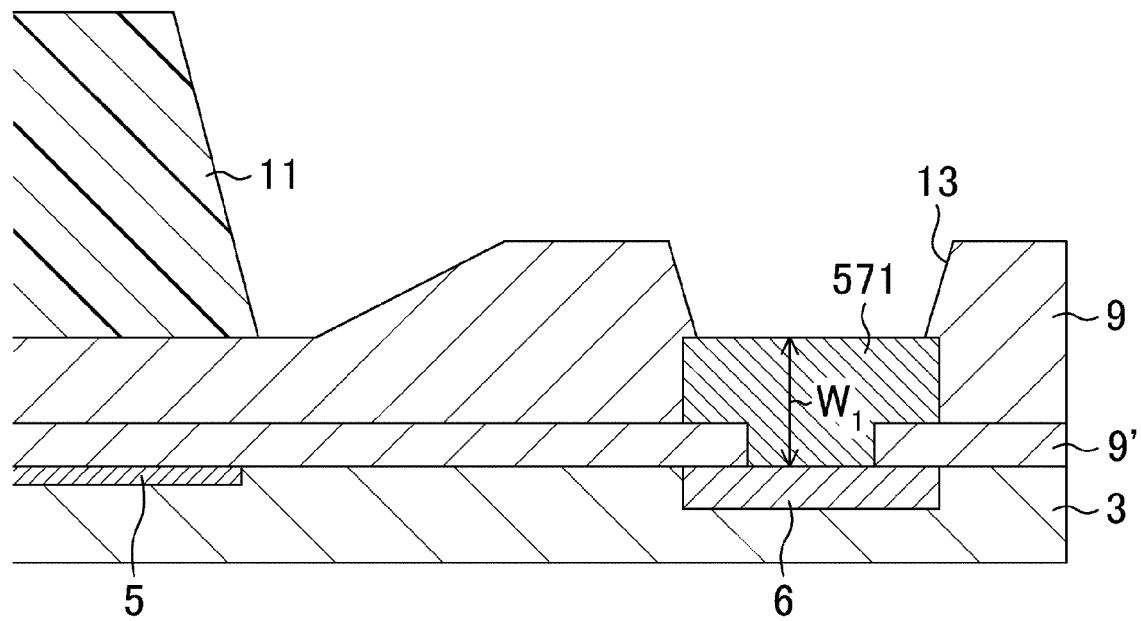
FIG. 12A is a cross-sectional view illustrating a connection electrode terminal of a fifth variation.
Figure 12B:
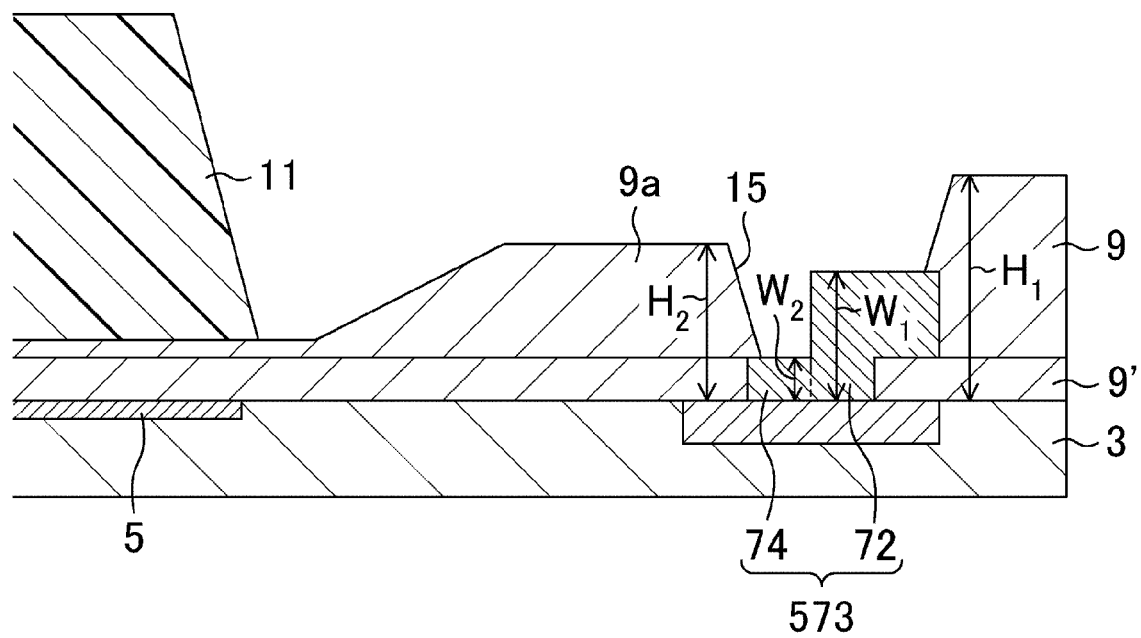
FIG. 12B is a cross-sectional view illustrating a testing electrode terminal of this variation.

FIG. 12A is a cross-sectional view illustrating a connection electrode terminal of a fifth variation. FIG. 12B is a cross-sectional view illustrating a testing electrode terminal of this variation. The positions of the thin portions in this variation differ from those in the first embodiment. The shapes of the connection electrode terminal and the testing electrode terminal in this variation also differ from those in the first embodiment. The following description is mainly given on aspects different from those in the first embodiment.

Unlike the first embodiment and other variations, each of connection electrode terminals 571 of this variation is made of two layers. The lower layer of the connection electrode terminal 571 is narrower than the upper layer of the connection electrode terminal 571. The upper layer of the connection electrode terminal 571 is surrounded by the protection film 9, whereas the lower layer of the connection electrode terminal 571 is surrounded by a protection film 9' provided under the protection film 9. The sum of the thickness of the lower layer of the connection electrode terminal 571 and the thickness of the upper layer of the connection electrode terminal 571 is $W_1$, as described in the first embodiment, for example.

Each of testing electrode terminals 573 of this variation has the thick portion 72 and the thin portion 74. The thin portion 74 is located closer to the resin film 11 than the thick portion 72 in the first direction. Specifically, the testing electrode terminal 573 has a shape obtained by removing, from the connection electrode terminal 571, a portion of the upper layer of the connection electrode terminal 571 except for a portion located close to the resin film 11. A portion of the upper layer located under the removed portion of the connection electrode terminal 571 is the thin portion 74. Accordingly, as in the first embodiment, the low-lying portion 9a of the protection film 9 extends from the opening 15 toward the resin film 11.

When the insulating resin is provided on the surface of the testing electrode terminal 573 described above, part of the insulating resin flows on the surfaces of the low-lying portions 9a of the protection film 9 from locations on the surfaces of the testing electrode terminals 573 toward the resin film 11 before drying. Accordingly, fabrication of semiconductor devices according to the first embodiment using the semiconductor wafer provided with a plurality of semiconductor integrated circuit devices including the testing electrode terminals 573 in this variation allows the height of the insulating resin on the surfaces of the testing electrode terminals of the semiconductor integrated circuit device having defective electrical characteristics to be smaller than that in a reference technique. As a result, as described in the first embodiment, the manufacturing yield of semiconductor devices can be increased in this variation. In addition, in this variation, the following advantages can be obtained.

In the semiconductor device, a Cu layer 6 is provided in portions of the semiconductor substrate located under the electrode terminals in some cases. In this case, in providing the connection electrode terminals 71 and the testing electrode terminals 73 of, for example, the first embodiment, on the Cu layer 6, a layer made of an electrode material (e.g., an Al layer) is provided on the surface of the semiconductor wafer, and is then etched. In this etching, a mask is formed on the surface of the layer of the electrode material, and only a portion of this layer exposed from the mask is etched. However, in this etching, part of the Cu layer 6 (especially an edge portion of the Cu layer 6) located under portions to be connection electrode terminals 71 or testing electrode terminals 73 might be etched. If Cu is released in a chamber in which the layer of the electrode material is etched, etching on the layer of the electrode material is stopped.

On the other hand, in this variation, a center portion of the surface of the Cu layer 6 is covered with the connection electrode terminal 571 or the testing electrode terminal 573, whereas the edge portion of the Cu layer 6 is covered with the protection film 9'. Accordingly, in etching the layer of the electrode material, it is possible to reduce etching on the edge portion of the Cu layer 6. As a result, the layer of the electrode material can be etched into a desired shape.

(Sixth Variation)

Figure 13:
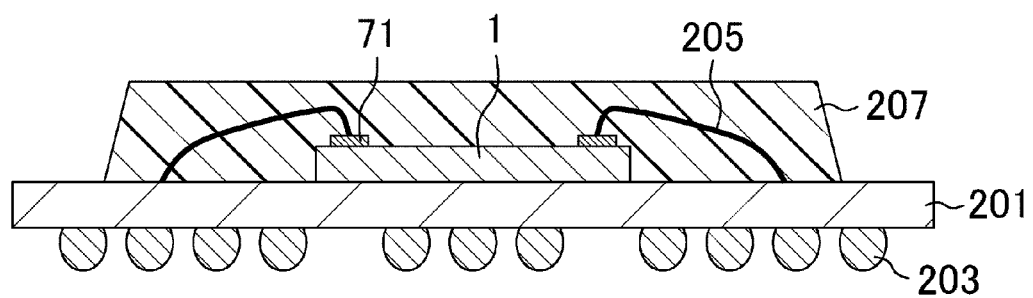
FIG. 13 is a cross-sectional view illustrating another example of the semiconductor device.

FIG. 13 is a cross-sectional view illustrating a semiconductor device according to a sixth variation. In FIG. 13, a detailed configuration of a semiconductor integrated circuit device of this variation is not shown. Only the difference between this variation and the first embodiment is the configuration of the semiconductor device.

The semiconductor device of this variation employs a BGA. In the BGA, the semiconductor integrated circuit device 1 of the first embodiment is provided on the surface of a wring board 201. In the wiring board 201, a plurality of electrodes (not shown) are provided on the top surface, a plurality of through-hole electrodes (not shown) penetrate along the thickness direction of the wiring board 201, and a plurality of solder balls 203, 203, . . . are provided on the bottom surface. The electrodes (i.e., the electrodes provided on the top surface of the wiring board 201) are connected to the solder balls 203 via the though-hole electrodes, and are connected to the electrode terminals 71 and 73 of the semiconductor integrated circuit device 1 via conductive fine wires 205. The semiconductor integrated circuit device 1 and the conductive fine wires 205, 205, . . . are encapsulated with an encapsulating resin 207.

The semiconductor device as described above can be fabricated in the following manner. First, with the method described in the first embodiment, a test on electrical characteristics, wafer burn-in, and a back grinding process are sequentially performed, and then a semiconductor wafer is divided along dicing lines. In this manner, a semiconductor integrated circuit device 1 can be fabricated. The semiconductor integrated circuit device 1 is provided on the top surface of a wiring board 201, and electrode terminals 71 and 73 of the semiconductor integrated circuit device 1 and electrodes on the wiring board 201 are electrically connected with conductive fine wires 205. Thereafter, the top surface of the wiring board 201 is encapsulated with an encapsulating resin 207. In this manner, the semiconductor device illustrated in FIG. 13 can be fabricated.

Application of the first embodiment or one of the first to fifth variations to the semiconductor device of this variation can reduce occurrence of a crack in the semiconductor wafer in the back grinding process as described in the first embodiment.

In this variation, the configuration of the BGA is, of course, not limited to the configuration of FIG. 13.

Second Embodiment

Figure 14A:
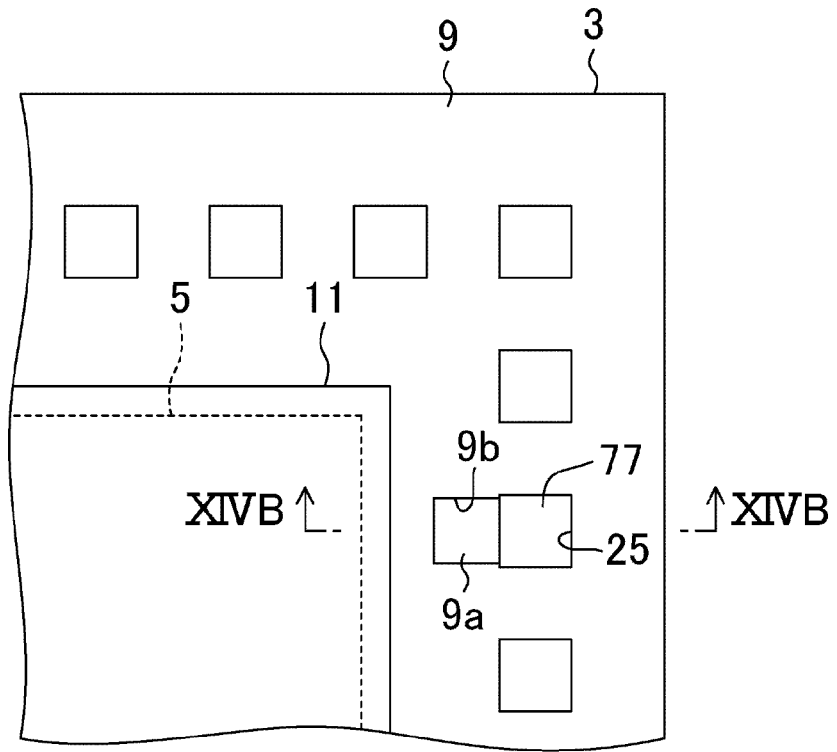
FIG. 14A is a top view illustrating a main portion of a semiconductor integrated circuit device according to a second embodiment.
Figure 14B:
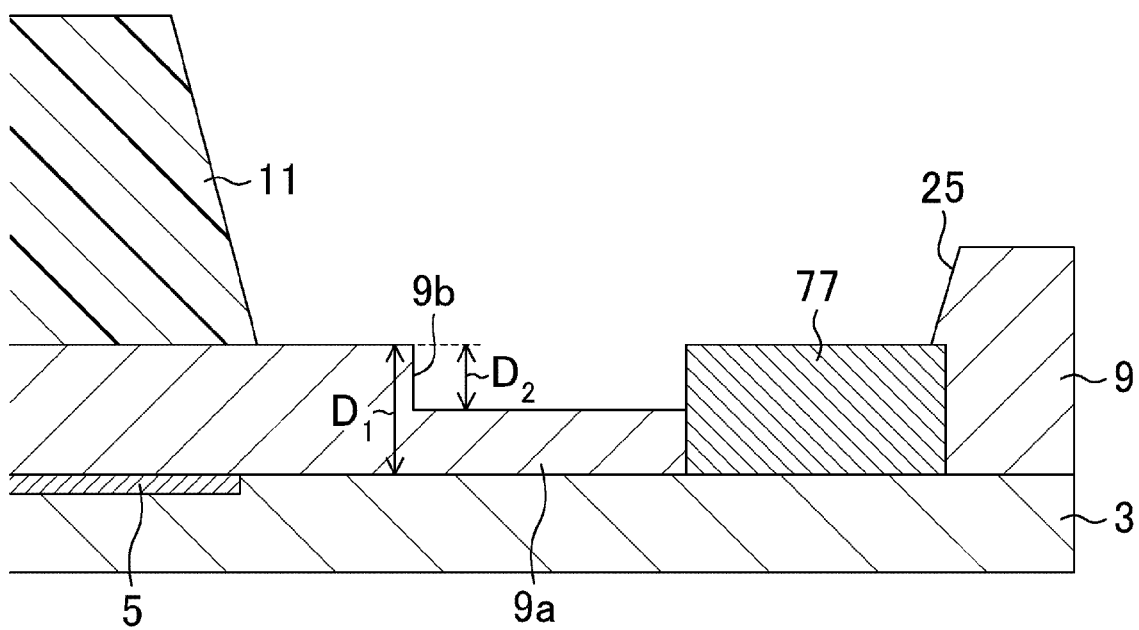
FIG. 14B is a cross-sectional view taken along line XIVB-XIVB in FIG. 14A.

FIG. 14A is a top view illustrating a main portion of a semiconductor integrated circuit device according to a second embodiment. FIG. 14B is a cross-sectional view taken along line XIVB-XIVB in FIG. 14A.

In this embodiment, testing electrode terminals 77 have no thin portions, and have a thickness identical to that of connection electrode terminals 71. Grooves 9b are formed in the surface of a protection film 9. The following description is mainly given on aspects different from those in the first embodiment.

In the second embodiment, the protection film 9 has openings in which the surfaces of the connection electrode terminals 71 are exposed, and openings 25 in which the surfaces of the testing electrode terminals 77 are exposed. Each of the grooves 9b communicates with an associated one of the openings 25, and extends from the opening 25 toward the resin film 11. Since such grooves 9b are formed in the surface of the protection film 9, part of the protection film 9 located under the grooves 9b serves as low-lying portions 9a.

The depth ($D_2$) of each of the grooves 9b is ¼ or more of the thickness ($D_1$) of the protection film 9, is preferably in the range from ¼ to ⅘, both inclusive, of the thickness ($D_1$) of the protection film 9, and is more preferably ½ of the thickness ($D_1$) of the protection film 9. In general, the thickness ($D_1$) of the protection film 9 is 850 nm. In this case, the depth ($D_2$) of each of the grooves 9b is 200 nm, is preferably in the range from 200 nm to 650 nm, both inclusive, and is more preferably 400 nm.

The semiconductor device of this embodiment can be fabricated with the method for fabricating a semiconductor device described in the first embodiment. Specifically, first, a semiconductor wafer in which a plurality of regions are defined by dicing lines is prepared, and a semiconductor integrated circuit device is formed on each of the regions. In forming a plurality of electrode terminals, a film made of an electrode material is formed over the entire surface of the semiconductor wafer, and is then etched. Accordingly, a plurality of electrode terminals having an identical thickness are formed on an edge portion of each of the regions such that the electrode terminals are located apart from each other. In forming a film to be a protection film 9, a film to be a protection film 9 is formed on the surface of the semiconductor wafer, and is then etched. In this manner, openings 25 and grooves 9b are formed on the film to be a protection film 9. The grooves 9b may be formed concurrently with formation of the openings in the film to be a protection film 9, or may be in a process different from the process of forming a plurality of openings in the film to be a protection film 9.

Next, a test is performed on electrical characteristics of each of the semiconductor integrated circuit devices on the semiconductor wafer. Then, an insulating resin is provided on the surfaces of testing electrode terminals of a semiconductor integrated circuit device whose electrical characteristics have been determined to be defective.

At this time, in a reference technique, grooves communicating with the openings are not formed in the surface of the protection film, and thus the protection film has no low-lying portions. Accordingly, if an insulating resin is provided on the surfaces of the testing electrode terminals of the semiconductor integrated circuit device having defective electrical characteristics, most part of the insulating resin does not flow to locations on the surface of the protection film, and dries on the surfaces of the testing electrode terminals. As a result, the insulating resin becomes as high as about 10 μm, for example, on the surfaces of the testing electrode terminals, and projects to a height of 5 μm or more from the surface of the resin film.

On the other hand, in this embodiment, the grooves 9b are formed in the surface of the protection film 9, and communicate with the openings 25. Accordingly, when the insulating resin is provided on the surfaces of the testing electrode terminals of the semiconductor integrated circuit device having defective electrical characteristics, part of the insulating resin flows from locations on the surfaces of the testing electrode terminals to locations on the surfaces of the low-lying portions 9a before drying. As a result, as in the first embodiment, the height of the insulating resin on the surfaces of the testing electrode terminals can be smaller than that in the reference technique.

In addition, in this embodiment, since each of the grooves 9b extends from an associated one of the openings 25 toward the resin film 11, the low-lying portion 9a of the protection film 9 extends from the opening 25 toward the resin film 11. Accordingly, when the insulating resin is provided on the surfaces of the testing electrode terminals of the semiconductor integrated circuit device having defective electrical characteristics, part of the insulating resin is allowed to flow on the surfaces of the low-lying portions 9a from locations on the surfaces of the testing electrode terminals to reach the resin film 11 before drying. When the insulating resin comes into contact with the resin film 11, affinity between the resin film 11 and the insulating resin enables a larger amount of the insulating resin to flow from locations on the surfaces of the testing electrode terminals to the resin film 11 before drying. Accordingly, in the configuration in which each of the grooves 9b extends from an associated one of the openings 25 toward the resin film 11 as in this embodiment, the height of the insulating resin on the surfaces of the testing electrode terminals can be reduced, as compared to a configuration in which the grooves 9b are provided at other locations.

Then, burn-in is performed on a plurality of semiconductor integrated circuit devices in a batch.

Subsequently, a back grinding process is performed.

At this time, the insulating resin projects from the surface of the resin film to be as high as 5 μm or more in the reference technique. Accordingly, when a back grinding sheet is provided on the surface of a semiconductor wafer, and then the semiconductor wafer is turned upside down so that the semiconductor wafer is placed on the surface of a polishing table, only part of the insulating resin in contact with the polishing table serves as a point supporting the wafer. Thus, it is difficult to place the semiconductor wafer on the polishing table with stability, and thus the semiconductor wafer shakes on the polishing table. Consequently, the insulator resin is subjected to a high force during polishing, resulting in a crack in the semiconductor wafer.

On the other hand, in this embodiment, the insulating resin is lower than that in the reference technique. Accordingly, the process of providing the back grinding sheet on the surface of the semiconductor wafer, turning the semiconductor wafer upside down, and then placing the semiconductor wafer on the surface of the polishing table can reduce a shake of the semiconductor wafer on the polishing table. As a result, the insulating resin is not subjected to an extremely high force during polishing, thereby reducing occurrence of a crack in the semiconductor wafer.

Thereafter, with known methods, formation of a redistribution layer, formation of an encapsulating resin, formation of bump electrodes, and placement of solder balls are performed. In this manner, a semiconductor device can be fabricated on each region. Subsequently, the semiconductor wafer is divided along dicing lines. In this manner, a semiconductor device of this embodiment can be fabricated.

In a case where solder balls are provided on the surfaces of the connection electrode terminals, the insulating resin projects from the surface of the resin film to be as high as 5 μm or more in the reference technique. Accordingly, a metal mask cannot be placed on the semiconductor wafer in such a manner that holes of the metal mask are located on the surfaces of connection electrode terminals of a semiconductor integrated circuit device having good electrical characteristics. Consequently, the connection positions of the solder balls shift from the surfaces of the connection electrode terminals of the semiconductor integrated circuit device having good electrical characteristics. In addition, in the reference technique, the metal mask might be crushed.

On the other hand, in this embodiment, the insulating resin is lower than that of the reference technique. Accordingly, a metal mask can be placed on the semiconductor wafer such that holes of the metal mask are located on the surfaces of connection electrode terminals of a semiconductor integrated circuit device having good electrical characteristics. Thus, the solder balls can be connected to the surfaces of the connection electrode terminals of the semiconductor integrated circuit device having good electrical characteristics. In addition, in this embodiment, the metal mask can be placed on the surface of the semiconductor wafer such that the holes of the metal mask are located on the surfaces of the connection electrode terminals of the semiconductor integrated circuit device having good electrical characteristics without a crush of the metal mask.

In summary, fabrication of semiconductor devices according to the above-described method using the semiconductor wafer provided with the film to be a protection film 9 including grooves 9b in this embodiment allows the height of the insulating resin on the surfaces of the testing electrode terminals of the semiconductor integrated circuit device having defective electrical characteristics to be smaller than that in the reference technique. Accordingly, occurrence of a crack in the semiconductor wafer in the back grinding process can be reduced. In placing the solder balls on the surfaces of the connection electrode terminals, the solder balls can be placed without being shifted from the surfaces of the connection electrode terminals. In this case, the solder balls can be placed without a crush of the metal mask. As a result, in this embodiment, the manufacturing yield of semiconductor devices can be increased, as compared to the reference technique.

Each of the grooves 9b of the protection film 9 of this embodiment extends from an associated one of the openings 25 toward the resin film 11. Accordingly, fabrication of semiconductor devices according to the above-described method using the semiconductor wafer provided with the film to be a protection film 9 including the grooves 9b in this embodiment allows the height of the insulating resin on the surfaces of the testing electrode terminals of the semiconductor integrated circuit device having defective electrical characteristics to be smaller than that in a configuration in which the grooves 9b are provided at locations different from those in this embodiment. Accordingly, in this embodiment, the manufacturing yield of semiconductor devices can be increased, as compared to the case where the grooves 9b are provided at locations different from those in this embodiment.

This embodiment may have the following configurations. The grooves may be those of one of seventh to ninth variations, which will be described later. The resin film may have recesses of tenth or eleventh variation, which will be described later. Comparison among grooves of this embodiment and the seventh and eighth variations below shows that a configuration in which the groove extends toward the resin film as in this embodiment can utilize affinity between the resin film and the insulating resin to allow a larger amount of the insulating resin to flow from locations on the surfaces of the testing electrode terminals to locations on the surface of the resin film. Accordingly, in this embodiment, the advantage of reducing the height of the insulating resin on the surfaces of the testing electrode terminals more effectively than in the seventh and eighth variations.

In this embodiment, the testing electrode terminals and the connection electrode terminals are provided as different components. Alternatively, an electrode terminal may serve as both a testing electrode terminal and a connection electrode terminal. In the case where an electrode terminal serves as both a testing electrode terminal and a connection electrode terminal, the grooves preferably communicate with all the openings formed in the protection film. The same holds in the seventh to eleventh variations below.

The semiconductor device of this embodiment may be the WL-CSP described in the first embodiment, or may be the BGA described in the sixth variation. The same holds in the seventh to eleventh variations below.

(Seventh Variation)

Figure 15A:
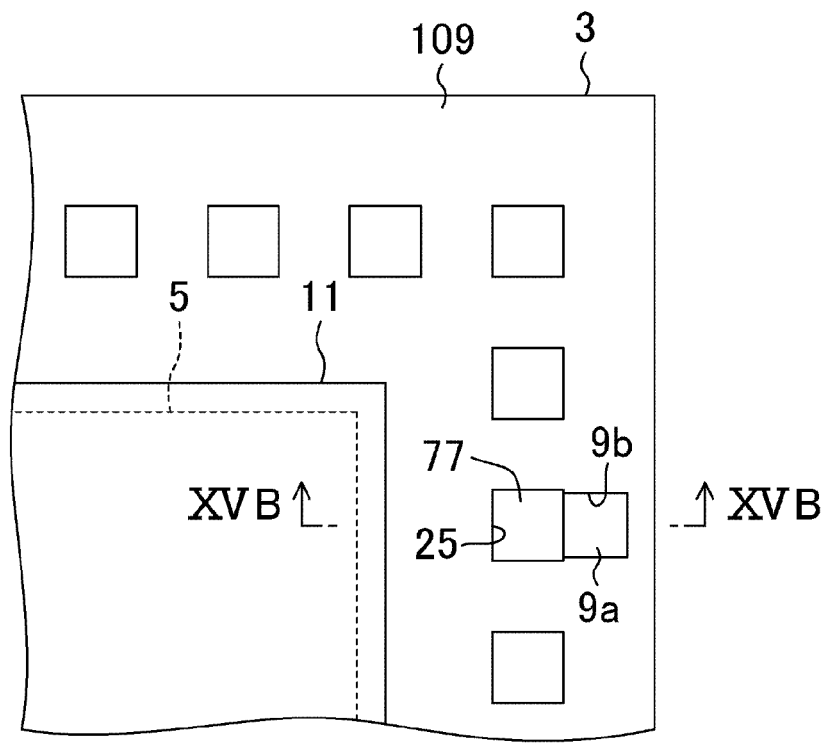
FIG. 15A is a top view illustrating a main portion of a semiconductor integrated circuit device according to a seventh variation.
Figure 15B:
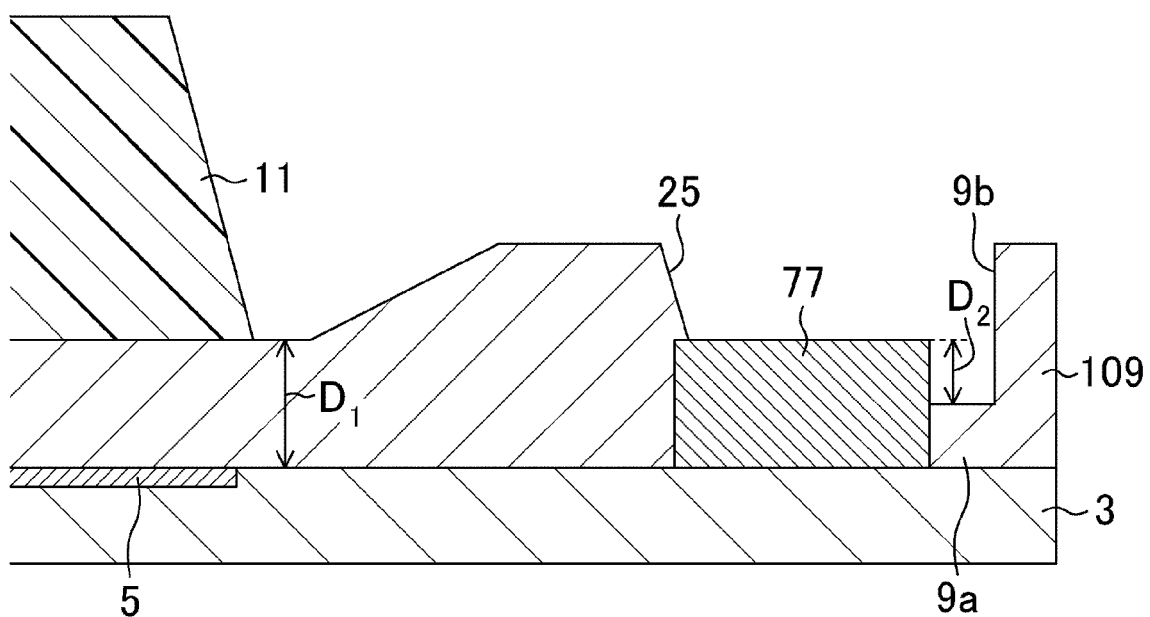
FIG. 15B is a cross-sectional view taken along line XVB-XVB in FIG. 15A.

FIG. 15A is a top view illustrating a main portion of a semiconductor integrated circuit device according to a seventh variation. FIG. 15B is a cross-sectional view taken along line XVB-XVB in FIG. 15A. The locations of grooves in this variation differ from those in the second embodiment. The following description is mainly given on aspects different from those in the second embodiment.

In this variation, each of the grooves 9b communicates with an associated one of the openings 25, and extends from the opening 25 toward the edge of the semiconductor substrate 3. Accordingly, each low-lying portion 9a of a protection film 109 also extends from the opening 25 toward the edge of the semiconductor substrate 3.

In this variation, when the insulating resin is provided on the surfaces of the testing electrode terminals 77, part of the insulating resin flows on the low-lying portions 9a of the protection film 109 from locations on the surfaces of the testing electrode terminals 77 toward the edge of the semiconductor substrate 3 before drying. Accordingly, fabrication of semiconductor devices according to the second embodiment using the semiconductor wafer provided with a plurality of semiconductor integrated circuit devices including the film to be a protection film 109 with the grooves 9b in this variation allows the height of the insulating resin on the surfaces of the testing electrode terminals of a semiconductor integrated circuit device having defective electrical characteristics to be smaller than that in a reference technique. As a result, as described in the second embodiment, the manufacturing yield of semiconductor devices can be increased in this variation, as compared to the reference technique.

In this variation, each of the grooves may be formed to extend from the opening in which the surface of the testing electrode terminal is exposed toward the edge of the semiconductor substrate.

(Eighth Variation)

Figure 16A:
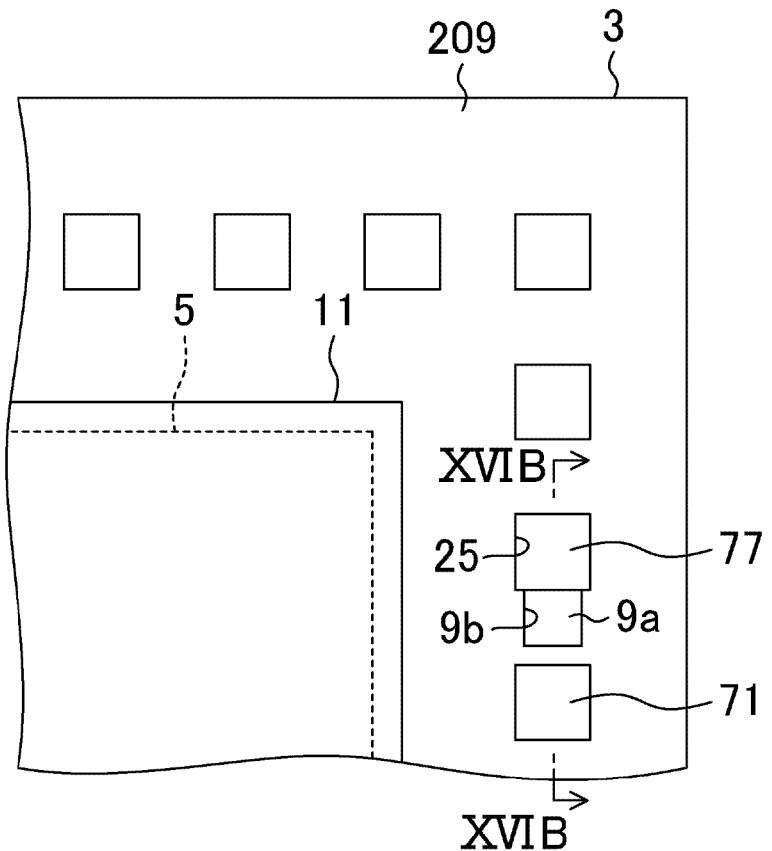
FIG. 16A is a top view illustrating a main portion of a semiconductor integrated circuit device according to an eighth variation.
Figure 16B:
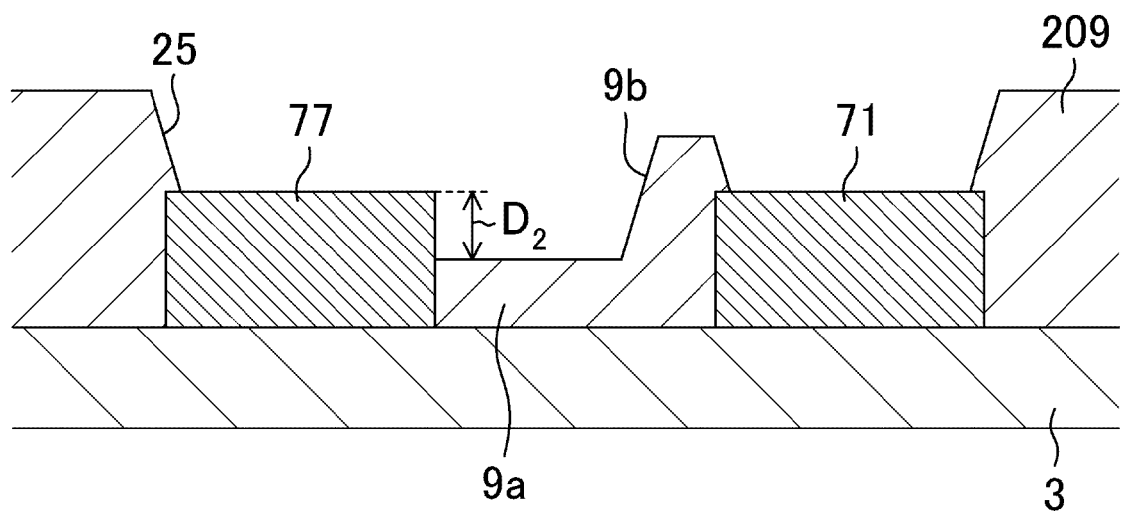
FIG. 16B is a cross-sectional view taken along line XVIB-XVIB in FIG. 16A.

FIG. 16A is a top view illustrating a main portion of a semiconductor integrated circuit device according to an eighth variation. FIG. 16B is a cross-sectional view taken along line XVIB-XVIB in FIG. 16A. The locations of grooves in this variation differ from those in the second embodiment. The following description is mainly given on aspects different from those in the second embodiment.

In this variation, each of the grooves 9b communicates with an associated one of the openings 25, and extends from the opening 25 to an electrode terminal (shown as a connection electrode terminal 71 in FIGS. 16A and 16B as an example) located adjacent to the testing electrode terminal 77. Accordingly, each low-lying portion 9a of a protection film 209 extends from the opening 25 to the electrode terminal adjacent to the testing electrode terminal 77.

In this variation, when the insulating resin is provided on the surfaces of the testing electrode terminals 77, part of the insulating resin flows on the low-lying portions 9a of the protection film 209 from locations on the surfaces of the testing electrode terminals 77 toward the electrode terminal adjacent to the testing electrode terminals 77 before drying. Accordingly, fabrication of semiconductor devices according to the second embodiment using the semiconductor wafer provided with a plurality of semiconductor integrated circuit devices including the film to be a protection film 209 with the grooves 9b in this variation allows the height of the insulating resin on the surfaces of the testing electrode terminals of a semiconductor integrated circuit device having defective electrical characteristics to be smaller than that in a reference technique. As a result, as described in the second embodiment, the manufacturing yield of semiconductor devices can be increased in this variation, as compared to the reference technique.

In this variation, each of the grooves may be formed to connect an opening in which the surface of the testing electrode terminal is exposed to an adjacent opening.

It is preferable to combine the second embodiment, the seventh variation, and the eighth variation. In other words, the grooves are preferably formed radially from the opening in which the surface of the testing electrode terminal is exposed. In this case, the low-lying portions of the protection film are formed radially from the testing electrode terminal, and thus the manufacturing yield of semiconductor devices can be increased, as compared to the second embodiment, the seventh variation, and the eighth variation.

(Ninth Variation)

Figure 17A:
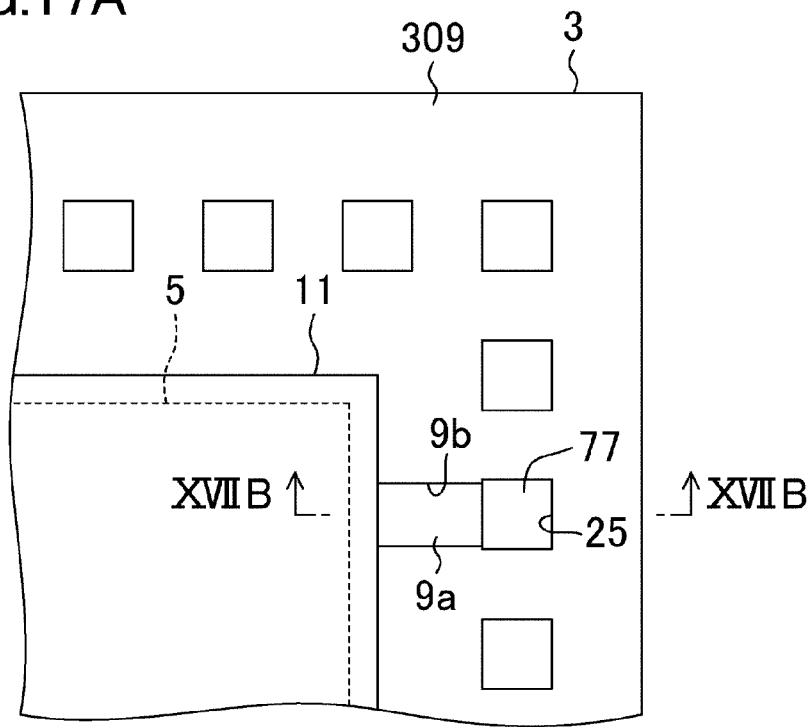
FIG. 17A is a top view illustrating a main portion of a semiconductor integrated circuit device according to a ninth variation.
Figure 17B:
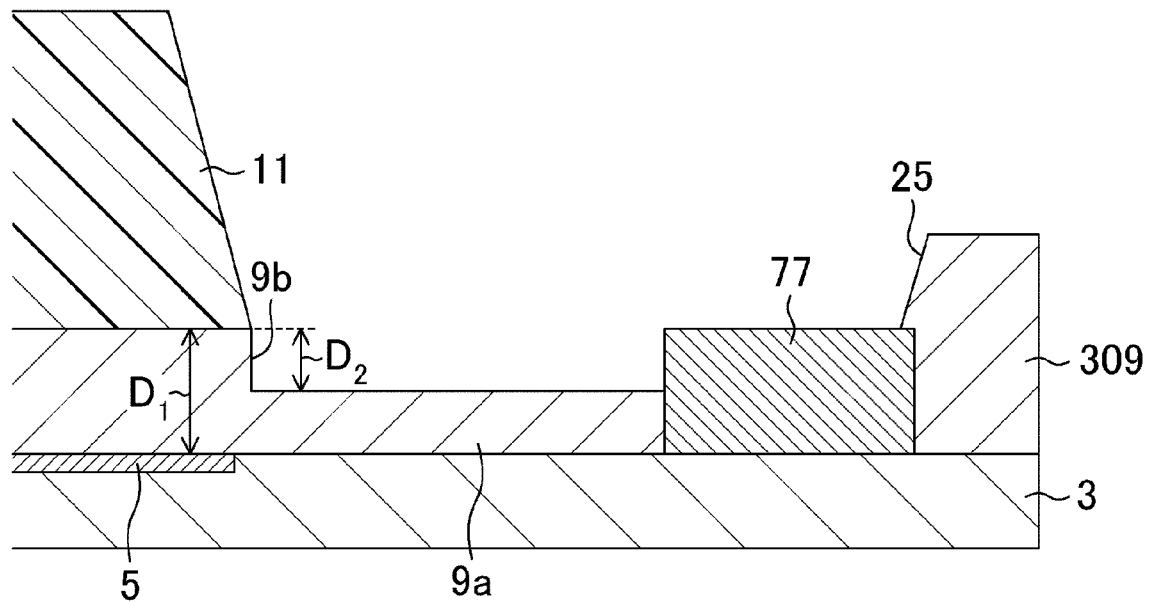
FIG. 17B is a cross-sectional view taken along line XVIIB-XVIIB in FIG. 17A.

FIG. 17A is a top view illustrating a main portion of a semiconductor integrated circuit device according to a ninth variation. FIG. 17B is a cross-sectional view taken along line XVIIB-XVIIB in FIG. 17A. The following description is mainly given on aspects different from those in the second embodiment.

In this variation, each of the grooves 9b communicates with an associated one of the openings 25, and extends from the opening 25 to reach a side surface of the resin film 11. Accordingly, each low-lying portion 9a of a protection film 309 extends from the opening 25 to reach a side surface of the resin film 11.

In this variation, when the insulating resin is provided on the surfaces of the testing electrode terminals 77, part of the insulating resin flows on the low-lying portions 9a of the protection film 309 from locations on the surfaces of the testing electrode terminals 77 toward the resin film 11 to reach the resin film 11 before drying. Accordingly, fabrication of semiconductor devices according to the second embodiment using the semiconductor wafer provided with a plurality of semiconductor integrated circuit devices including the film to be a protection film 309 with the grooves 9b in this variation allows the height of the insulating resin on the surfaces of the testing electrode terminals of a semiconductor integrated circuit device having defective electrical characteristics to be smaller than that in the second embodiment. As a result, in this variation, the manufacturing yield of semiconductor devices can be increased, as compared to the second embodiment.

(Tenth Variation)

Figure 18A:
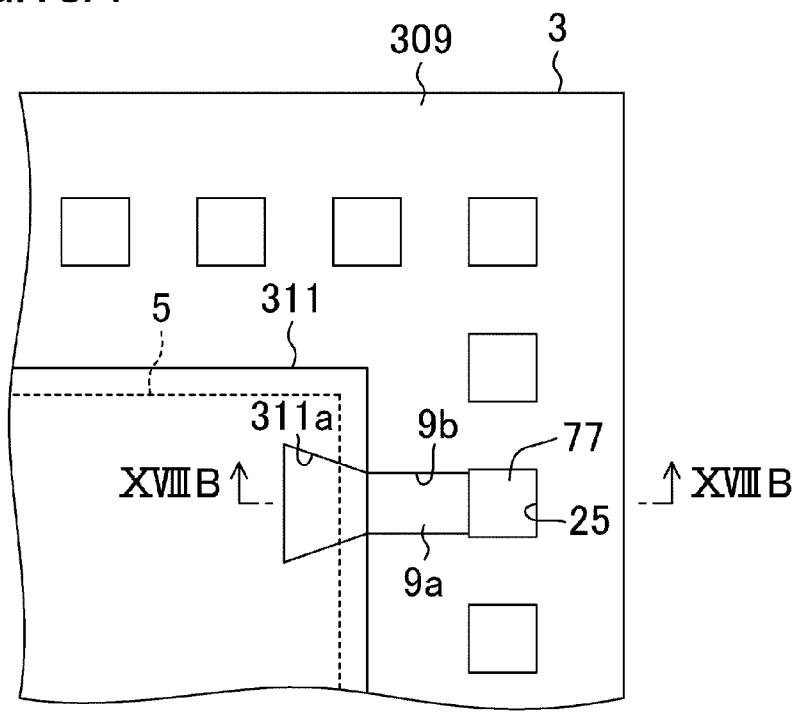
FIG. 18A is a top view illustrating a main portion of a semiconductor integrated circuit device according to a tenth variation.
Figure 18B:
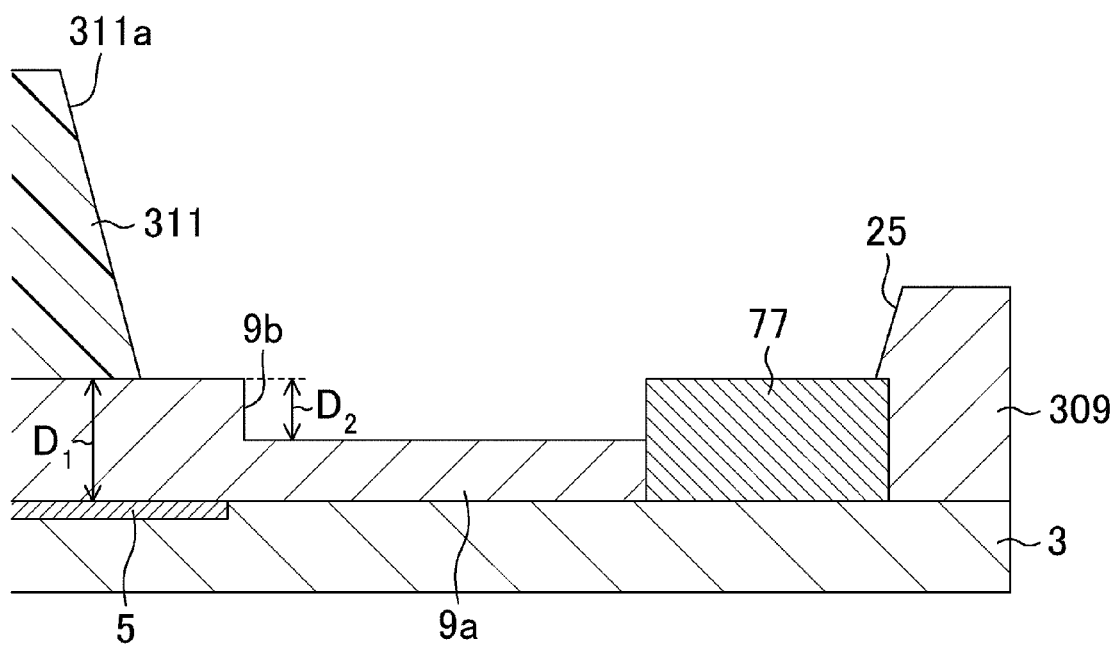
FIG. 18B is a cross-sectional view taken along line XVIIIB-XVIIIB in FIG. 18A.

FIG. 18A is a top view illustrating a main portion of a semiconductor integrated circuit device according to a tenth variation. FIG. 18B is a cross-sectional view taken along line XVIIIB-XVIIIB in FIG. 18A. The following description is mainly given on aspects different from those in the second embodiment.

As in the ninth variation, in the tenth variation, each of the grooves 9b communicates with an associated one of the openings 25, and extends from the opening 25 to a side surface of a resin film 311. Accordingly, each low-lying portion 9a of the protection film 309 also extends from the opening 25 to a side surface of the resin film 311.

In addition, in this variation, a recess 311a is formed in a side surface of the resin film 311. The recess 311a communicates with the groove 9b, and has its width increased toward the bottom of the recess 311a when viewed from above (i.e., in FIG. 18A).

In this variation, when the insulating resin is provided on the surfaces of the testing electrode terminals 77, part of the insulating resin flows on the low-lying portions 9a of the protection film 309 from locations on the surfaces of the testing electrode terminals 77 to reach the resin film 11, and enters the recess 311a before drying. Accordingly, fabrication of semiconductor devices according to the second embodiment using the semiconductor wafer provided with the film to be a protection film 309 having the grooves 9b in this variation and the resin film 311 in this variation allows the height of the insulating resin on the surfaces of the testing electrode terminals of a semiconductor integrated circuit device having defective electrical characteristics to be smaller than that in the ninth variation. As a result, in this variation, the manufacturing yield of semiconductor devices can be increased, as compared to the ninth variation.

The recess does not need to penetrate the resin film along the thickness thereof, and only needs to be formed in a portion of the resin film along the thickness thereof and communicate with the groove.

(Eleventh Variation)

Figure 19A:
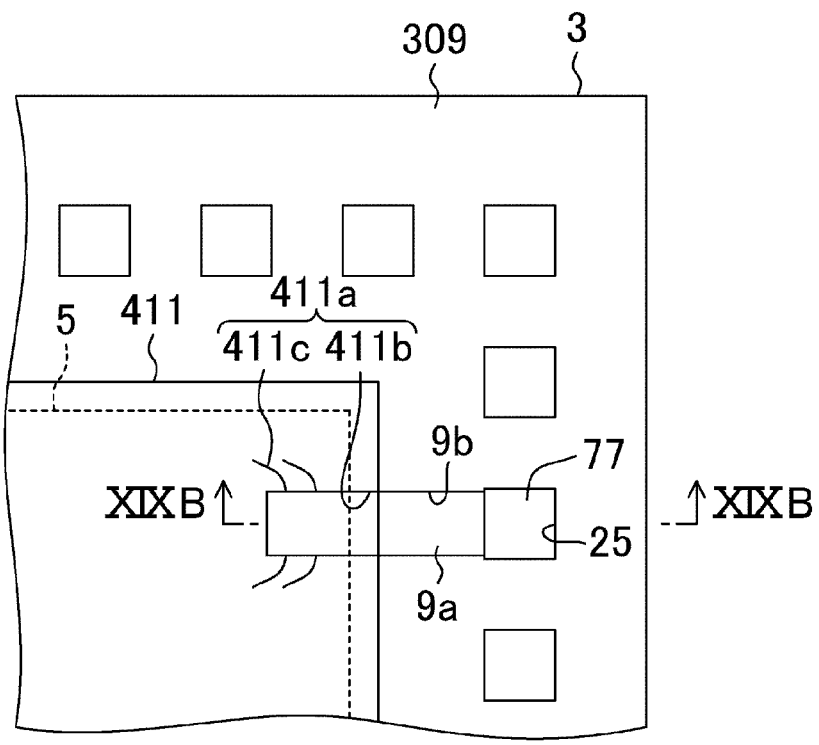
FIG. 19A is a top view illustrating a main portion of a semiconductor integrated circuit device according to an eleventh variation.
Figure 19B:
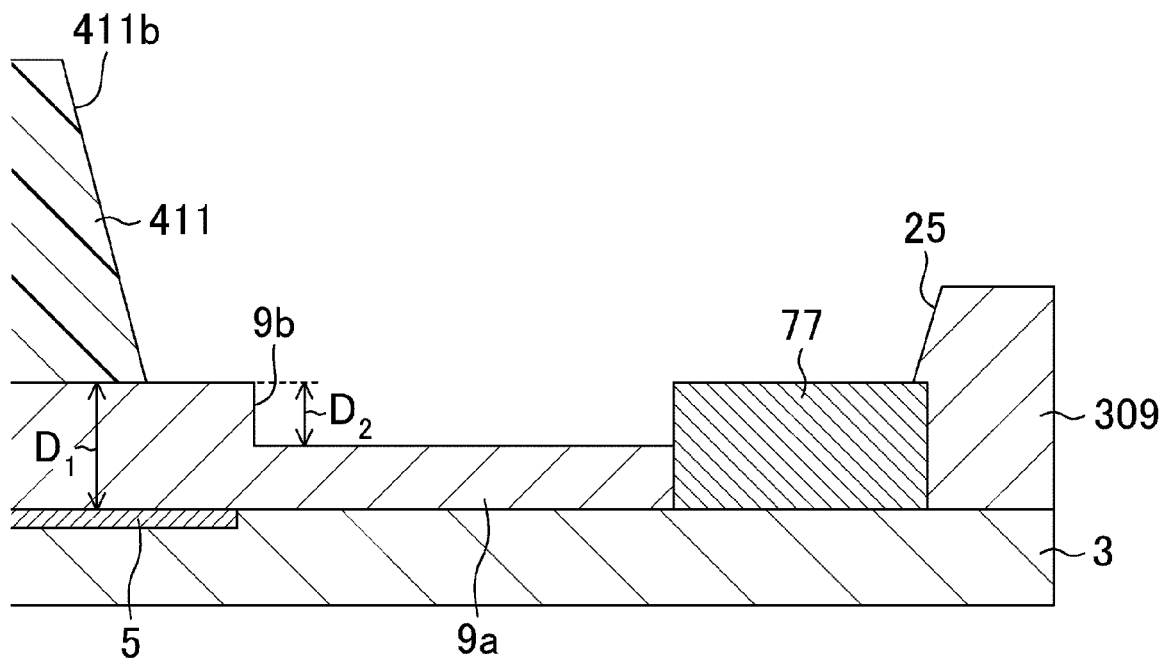
FIG. 19B is a cross-sectional view taken along line XIXB-XIXB in FIG. 19A.

FIG. 19A is a top view illustrating a main portion of a semiconductor integrated circuit device according to an eleventh variation. FIG. 19B is a cross-sectional view taken along line XIXB-XIXB in FIG. 19A. The following description is mainly given on aspects different from those in the second embodiment.

As in the ninth variation, in the eleventh variation, each of the grooves 9b communicates with an associated one of the openings 25, and extends from the opening 25 to a side surface of a resin film 411. Accordingly, each low-lying portion 9a of the protection film 309 also extends from the opening 25a to a side surface of the resin film 411.

In addition, in this variation, a recess 411a is formed in a side surface of the resin film 411. The recess 411a includes a body portion 411b and branch portions 411c. The body portion 411b communicates with the groove 9b. The branch portions 411c branch from the body portion 411b, and extend into the resin film 411. Each of the branch portions 411c is preferably formed to be tapered from the body portion 411b.

In this variation, when the insulating resin is provided on the surfaces of the testing electrode terminals 77, part of the insulating resin flows on the low-lying portions 9a of the protection film 309 from locations on the surfaces of the testing electrode terminals 77 to reach the resin film 11, and enters the recess 411a before drying. Since the recess 411a has the branch portions 411c, the insulating resin enters the resin film 411 through capillary action. Accordingly, fabrication of semiconductor devices according to the second embodiment using the semiconductor wafer provided with the film to be the protection film 309 having the grooves 9b in this variation and the resin film 411 in this variation allows the height of the insulating resin on the surfaces of the testing electrode terminals of a semiconductor integrated circuit device having defective electrical characteristics to be smaller than that in the tenth variation. As a result, in this variation, the manufacturing yield of semiconductor devices can be increased, as compared to the tenth variation.

In this variation, the recess does not need to penetrate the resin film along the thickness thereof, and only needs to be formed in a portion of the resin film along the thickness thereof and communicate with the groove.

The present disclosure has been described in the first embodiment, the first to sixth variations, the second embodiment, and the seventh to eleventh variations, but these embodiments and variations may be combined, of course. For example, the first embodiment and the first variation may be combined together, the first embodiment and the second embodiment may be combined together, the second embodiment and the seventh variation may be combined together, or some of the variations may be combined together. The semiconductor devices of the first embodiment, the first to fifth variations, the second embodiment, and the seventh to eleventh variations may be the semiconductor device of the sixth variation.

As described above, the present disclosure is useful for the structure of electrode terminals of a semiconductor integrated circuit device obtained by performing burn-in, in a batch, on a plurality of semiconductor integrated circuit devices formed on a semiconductor wafer.

What is claimed is:

1. A semiconductor device, comprising:
a semiconductor substrate;
a semiconductor integrated circuit provided in a surface of the semiconductor substrate;
a plurality of electrode terminals provided on the surface of the semiconductor substrate; and
a protection film provided on the surface of the semiconductor substrate, and exposing surfaces of the electrode terminals therefrom,
wherein the electrode terminals include a first electrode terminal and a second electrode terminal,
a part of a surface of the first electrode terminal is lower than a surface of the second electrode terminal, and
the first electrode terminal includes a thin portion and a thick portion connected to the thin portion, and
a surface of a portion of the protection film in contact with the thin portion is lower than a surface of a portion of the protection film in contact with the thick portion.

2. The semiconductor device of claim 1, wherein
a resin film is provided on a surface of the protection film, and
the thin portion is located closer to the resin film than the thick portion in a direction from an edge of the surface of the semiconductor substrate toward a center thereof.

3. The semiconductor device of claim 1, wherein all portions of the surface of the first electrode terminal are lower than the surface of the second electrode terminal.

4. The semiconductor device of claim 1, wherein the first electrode terminal is an electrode terminal for use in burn-in.

5. The semiconductor device of claim 1, wherein
the surface of the first electrode and the surface of the second electrode are lower than a surface of the protection film.

6. The semiconductor device of claim 1, wherein the first electrode is adjacent to the second electrode via a part of the protection film.

7. The semiconductor device of claim 1, wherein
a direction from the thin portion toward the thick portion is substantially parallel to a side surface of the semiconductor substrate.

8. The semiconductor device of claim 1, wherein
a direction from the thin portion toward the thick portion is substantially perpendicular to a side surface of the semiconductor substrate.

9. The semiconductor device of claim 1, wherein
a resin film is provided on a surface of the protection film,
an electrode is provided in the resin film, and
the second electrode is connected to the electrode in the resin film.

10. The semiconductor device of claim 1, wherein a solder ball is provided on the electrode in the resin.

11. A semiconductor device, comprising:
a semiconductor substrate;
a semiconductor integrated circuit provided in a surface of the semiconductor substrate;
a plurality of electrode terminals provided on the surface of the semiconductor substrate; and
a protection film provided on the surface of the semiconductor substrate,
wherein the protection film has openings in which surfaces of the electrode terminals are exposed,
a groove communicating with at least one of the openings is disposed in a surface of the protection film,
a resin film is provided on a surface of the protection film, and the groove extends toward the resin film,
the groove reaches a side surface of the resin film, and
a recess communicating with the groove is disposed in the side surface of the resin film.

12. The semiconductor device of claim 11, wherein a width of a plan view of the recess increases from the side surface of the resin film toward an inside of the resin film.

13. The semiconductor device of claim 11, wherein the recess includes a body portion communicating with the groove and a branch portion branching from the body portion toward an inside of the resin film.

14. The semiconductor device of claim 11, wherein the groove communicates with the opening in which the surface of the electrode terminal for use in burn-in is exposed.

* * * * *